US010074535B2

(12) United States Patent
Matsuoka et al.

(10) Patent No.: US 10,074,535 B2
(45) Date of Patent: Sep. 11, 2018

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Tatsuru Matsuoka, Toyama (JP); Yoshiro Hirose, Toyama (JP); Yoshitomo Hashimoto, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 15/204,781

(22) Filed: Jul. 7, 2016

(65) Prior Publication Data

US 2017/0011908 A1 Jan. 12, 2017

(30) Foreign Application Priority Data

Jul. 10, 2015 (JP) .................................. 2015-139218

(51) Int. Cl.
*H01L 21/31* (2006.01)
*H01L 21/02* (2006.01)
(Continued)

(52) U.S. Cl.
CPC .. *H01L 21/02126* (2013.01); *C23C 16/45531* (2013.01); *H01L 21/0214* (2013.01);
(Continued)

(58) Field of Classification Search
CPC ................ H01L 21/02126; H01L 21/0214
See application file for complete search history.

(56) References Cited

U.S. PATENT DOCUMENTS 9,123,530 B2 * 9/2015 Ota ........................ C23C 16/30
2002/0014205 A1 2/2002 Shin et al.
(Continued)

FOREIGN PATENT DOCUMENTS

JP 2009-182286 A 8/2009
JP 2013-140944 A 7/2013
(Continued)

OTHER PUBLICATIONS

Office Action in KR counterpart Application No. 10-2016-0086061 dated Oct. 17, 2017.

*Primary Examiner* — Bradley K Smith
(74) *Attorney, Agent, or Firm* — Volpe and Koenig, P.C.

(57) ABSTRACT

A method of manufacturing a semiconductor device includes forming a film on a substrate by performing a cycle a predetermined number of times. The cycle includes non-simultaneously performing: supplying a precursor containing a predetermined element to the substrate in a process chamber, removing the precursor from the process chamber, supplying a first reactant containing nitrogen, carbon and hydrogen to the substrate, removing the first reactant from the process chamber, supplying a second reactant containing oxygen to the substrate, and removing the second reactant from the process chamber. A time period of the act of removing the precursor is set to be longer than a time period of the act of removing the first reactant, or a time period of the act of removing the second reactant is set to be longer than the time period of the act of removing the first reactant.

18 Claims, 9 Drawing Sheets

(51) Int. Cl.
*H01L 21/67* (2006.01)
*H01L 21/673* (2006.01)
*C23C 16/455* (2006.01)

(52) U.S. Cl.
CPC .... *H01L 21/0228* (2013.01); *H01L 21/67109* (2013.01); *H01L 21/67316* (2013.01)

(56) References Cited

U.S. PATENT DOCUMENTS

| | | | |
|---|---|---|---|
| 2013/0149873 A1 | 6/2013 | Hirose et al. | |
| 2013/0237064 A1* | 9/2013 | Kirikihira | H01L 21/67109 438/758 |
| 2014/0242809 A1* | 8/2014 | Hashimoto | H01L 21/02126 438/778 |

FOREIGN PATENT DOCUMENTS

| | | |
|---|---|---|
| JP | 2013-187507 A | 9/2013 |
| KR | 10-2002-0003897 | 1/2002 |
| KR | 10-2014-0106397 | 9/2014 |
| WO | 2011/123792 A2 | 10/2011 |

* cited by examiner

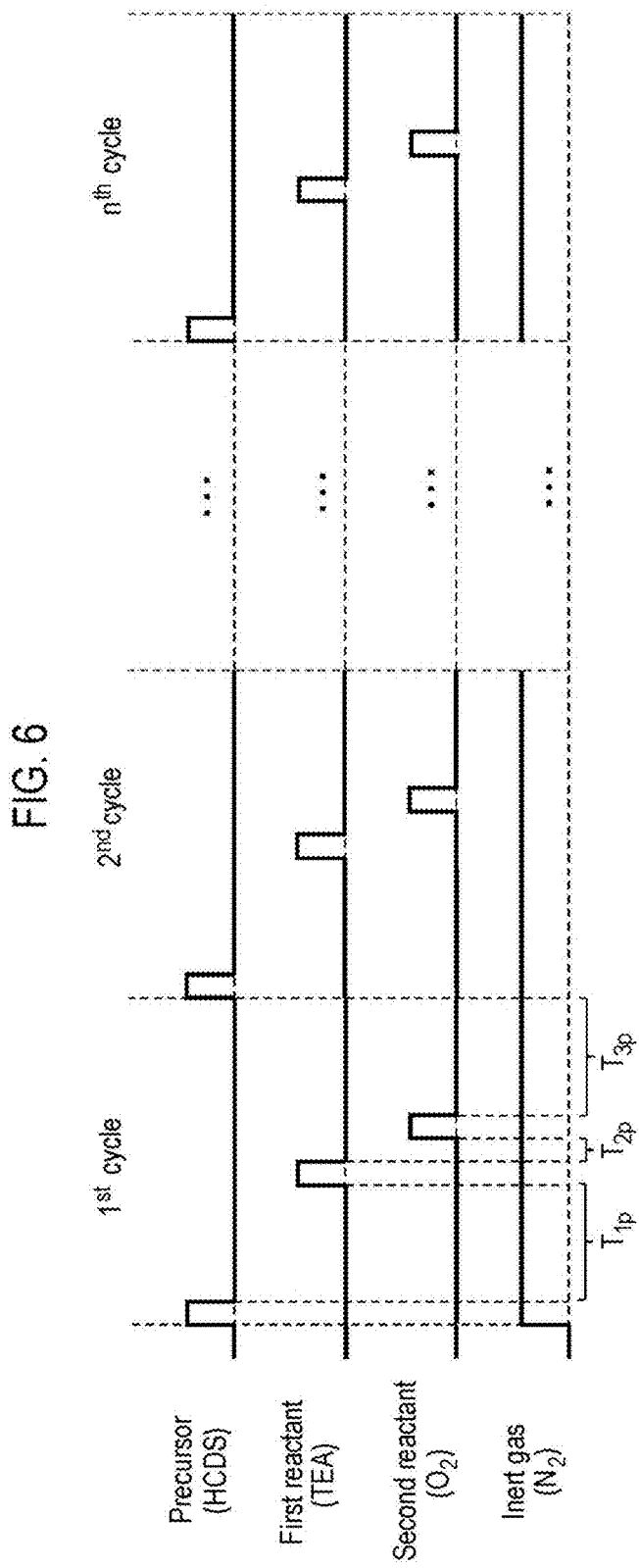

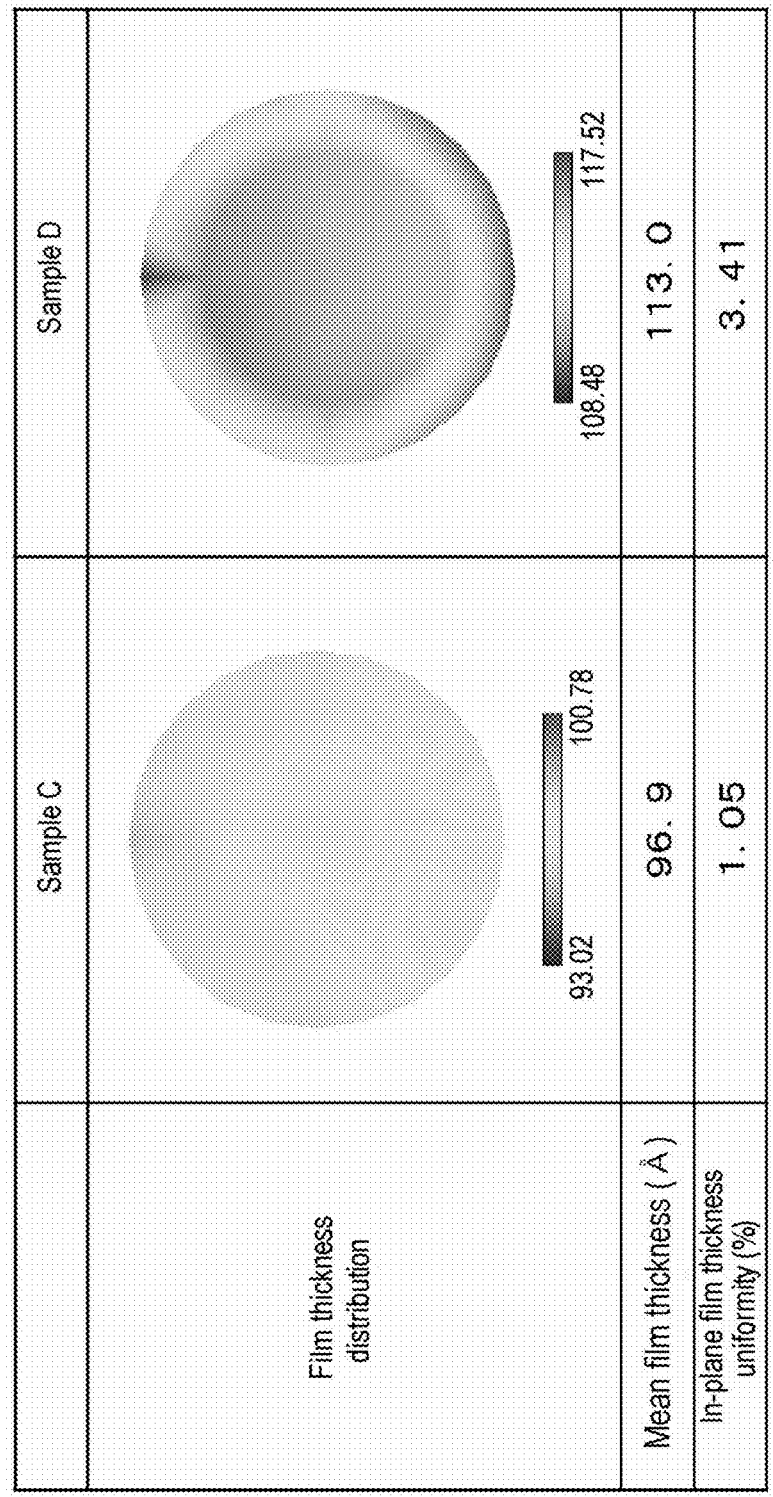

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION(S)

This application is based upon and claims the benefit of priority from Japanese Patent Application No. 2015-139218, filed on Jul. 10, 2015, the entire contents of which are incorporated herein by reference.

TECHNICAL FIELD

The present disclosure relates to a method of manufacturing a semiconductor device, a substrate processing apparatus, and a recording medium.

BACKGROUND

As an example of processes of manufacturing a semiconductor device, a process of forming a film on a substrate in a process chamber is often carried out by supplying a precursor and a plurality of kinds of reactants to the substrate.

SUMMARY

The present disclosure provides some embodiments of a technique capable of improving the quality of a film formed on a substrate.

According to one embodiment of the present disclosure, there is provided a technique, including forming a film on a substrate by performing a cycle a predetermined number of times, the cycle including non-simultaneously performing: supplying a precursor containing a predetermined element to the substrate in a process chamber; removing the precursor from the process chamber; supplying a first reactant containing nitrogen, carbon and hydrogen to the substrate in the process chamber; removing the first reactant from the process chamber; supplying a second reactant containing oxygen to the substrate in the process chamber; and removing the second reactant from the process chamber, wherein a time period of the act of removing the precursor is set to be longer than a time period of the act of removing the first reactant, or a time period of the act of removing the second reactant is set to be longer than the time period of the act of removing the first reactant.

BRIEF DESCRIPTION OF THE DRAWINGS

FIG. 6 is a diagram illustrating one example of a film forming sequence according to a different embodiment of the present disclosure.

FIG. 8 is a diagram illustrating results of evaluation on in-plane film thickness uniformity of a film.

DETAILED DESCRIPTION

<Findings Obtained by the Present Inventors>

As a method of forming a multicomponent-based film on a substrate, a film forming sequence of performing, a predetermined number of times, a cycle that non-simultaneously supplies a plurality of kinds of process gases onto a substrate in a process chamber is known. When a variety of conditions such as the kind, flow rate and supply time of a process gas, the temperature of a substrate, the internal pressure of a process chamber and so on (hereinafter referred to as process gas supply conditions) are appropriately selected, it is possible to closely control the quality (for example, etching resistance, insulating property, in-plane film thickness uniformity and so on) of a film formed on a substrate.

However, the studies made by the present inventors have revealed that it is often difficult to increase the quality of a film formed on a substrate over a certain level no matter how the process gas supply conditions are controlled with high precision. In addition, in order to further improve the quality of the film formed in the substrate, it has been revealed that it is necessary to appropriately select conditions of purge processing for removing a process gas from the process chamber (hereinafter referred to as purge conditions), in addition to the process gas supply conditions. The intensive studies made by the present inventors have also revealed that it is possible to further improve the quality of the film formed on the substrate without impairing the productivity of a film forming process by setting processing conditions of a purging process, which is performed a predetermined number of times per cycle, differently in an appropriate manner depending on the kind of a process gas to be removed, rather than equally with no distinction. For example, when the purge conditions are differently set depending on the kind of a process gas to be removed, it is possible to improve the etching resistance, insulating property or in-plane film thickness uniformity of the film without impairing the productivity of the film forming process.

The present disclosure has been accomplished based on the above-described findings obtained by the present inventors.

<First Embodiment of the Present Disclosure>

A first embodiment of the present disclosure will now be described with reference to FIGS. 1 to 3.

(1) Configuration of Substrate Processing Apparatus

Figure 1:
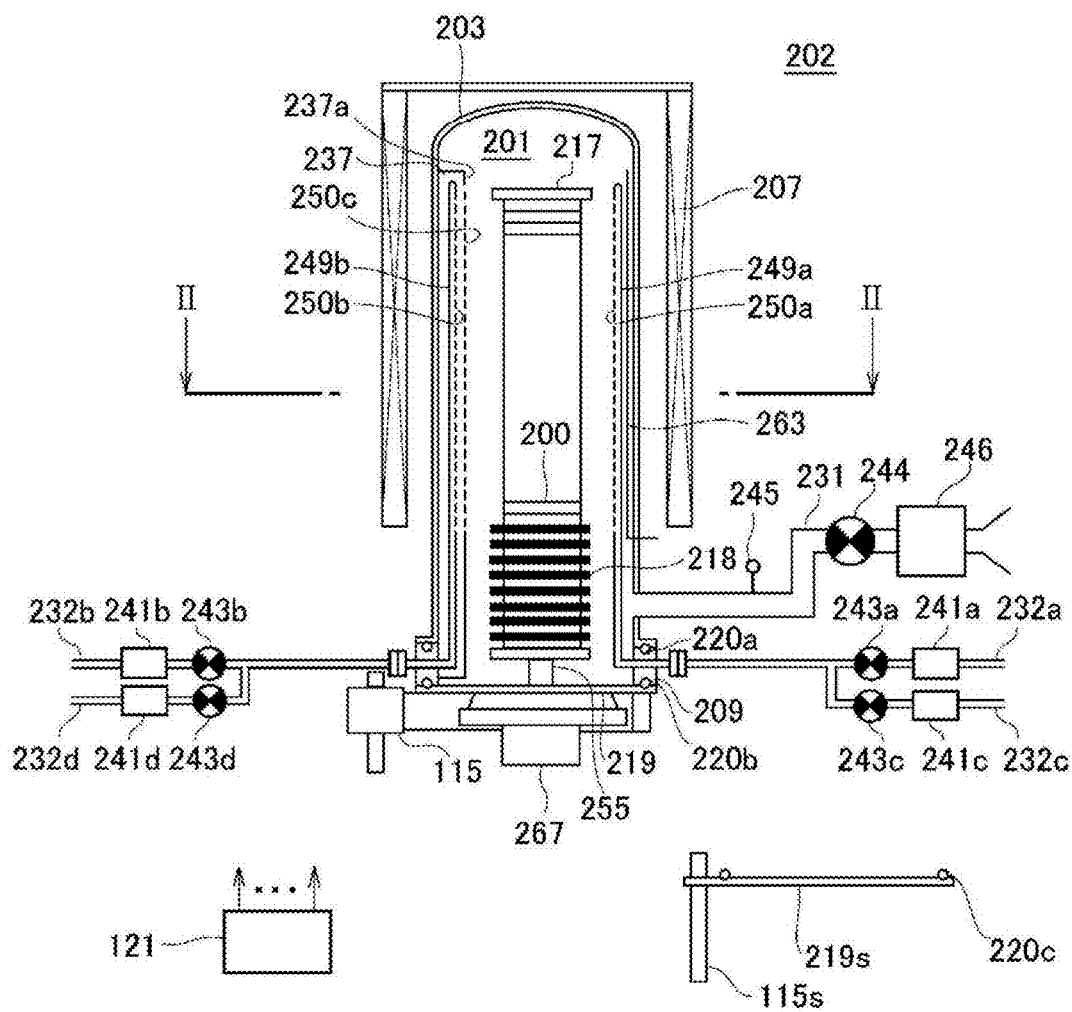
FIG. 1 is a schematic configuration view of a vertical processing furnace of a substrate processing apparatus suitably used in an embodiment of the present disclosure, in which a portion of the processing furnace is shown in a vertical cross section.

As shown in FIG. 1, a processing furnace 202 includes a heater 207 as a heating mechanism (a temperature adjustment part). The heater 207 has a cylindrical shape and is supported by a heater base (not shown) serving as a support plate so as to be vertically installed. As will be described later, the heater 207 functions as an activation mechanism (an excitation part) configured to thermally activate (excite) a gas.

A reaction tube 203 is disposed inside the heater 207 in a concentric relationship with the heater 207. The reaction tube 203 is made of, e.g., a heat resistant material such as quartz ($SiO_2$), silicon carbide (SiC) or the like and has a cylindrical shape with its upper end closed and its lower end opened. A manifold (inlet flange) 209 is disposed in a concentric relationship with the reaction tube 203 under the reaction tube 203, The manifold 209 is made of, e.g., metal such as stainless steel (SUS) or the like and has a cylindrical shape with its upper end closed and its lower end opened. The upper end portion of the manifold 209 engages with the lower end portion of the reaction tube 203 so as to support the reaction tube 203. An O-ring 220a serving as a seal member is installed between the manifold 209 and the reaction tube 203. As the manifold 209 is supported by the heater base, the reaction tube 203 is in a state of being vertically installed. A process vessel (reaction vessel) is mainly constituted by the reaction tube 203 and the manifold 209. A process chamber 201 is formed in a hollow cylindrical portion of the process vessel. The process chamber 201 is accommodated with a plurality of wafers 200 as substrates. The wafers 200 are horizontally stacked at multiple stages along a vertical direction in a boat 217 which will be described later.

Nozzles 249a 249b are installed in the process chamber 201 so as to penetrate through a sidewall of the manifold 209. Gas supply pipes 232a and 232b are respectively connected to the nozzles 249a and 249b. In this way, the two nozzles 249a and 249b and the two gas supply pipes 232a and 232b are installed in the process vessel (the manifold 209), thereby allowing plural kinds of gases to be supplied to the process chamber 201.

Mass flow controllers (WC) 241a and 241b, which are flow rate controllers (flow rate control parts), and valves 243a and 243b, which are opening/closing valves, are installed in the gas supply pipes 232a and 232b sequentially from the corresponding upstream sides, respectively. Gas supply pipes 232c and 232d, which supply an inert gas, are respectively connected to the gas supply pipes 232a and 232b at the downstream side of the valves 243a and 243b. MFCs 241c and 241d, which are flow rate controllers (flow rate control parts), and valves 243c and 243d, which are opening/closing valves, are installed in the gas supply pipes 232c and 232d sequentially from the corresponding upstream sides, respectively.

The nozzle 249a is connected to a front end portion of the gas supply pipe 232a. As shown in FIG. 2, the nozzle 249a is disposed in an annular space (when viewed from top) between the inner wall of the reaction tube 203 and the wafers 200 such that the nozzle 249a extends upward along a stack direction of the wafers 200 from a lower portion of the inner wall of the reaction tube 203 to an upper portion thereof. Specifically, the nozzle 249a is installed in a region horizontally surrounding a wafer arrangement region in which the wafers 200 are arranged at a lateral side of the wafer arrangement region, along the wafer arrangement region. That is to say, the nozzle 249a is installed in a perpendicular relationship with the surfaces (flat surfaces) of the wafers 200 at a lateral side of the end portions (peripheral edge portions) of the wafers 200, which are carried into the process chamber 201. The nozzle 249a is configured as an L-shaped nozzle. A horizontal portion of the nozzle 249a is installed to penetrate a sidewall of the manifold 209. A vertical portion of the nozzle 249a is installed to extend upward at least from one end portion of the wafer arrangement region toward the other end portion thereof. A gas supply hole 250a for supplying a gas is formed on the side surface of the nozzle 249a. The gas supply hole 250a is opened toward the center of the reaction tube 203 to allow the gas to be supplied toward the wafers 200. A plurality of gas supply holes 250a may be formed between the lower portion of the reaction tube 203 and the upper portion thereof. The plurality of gas supply holes 250a may be formed to have the same aperture area at the same aperture pitch.

The nozzle 249b is connected to a front end portion of the gas supply pipe 232b. The nozzle 249b is disposed in a buffer chamber 237 serving as a gas dispersion space. The buffer chamber 237 is formed between the inner wall of the reaction tube 203 and a partition wall 237a. As shown in FIG. 2, the buffer chamber 237 (the partition wall 237a) is disposed in an annular space (when viewed from top) between the inner wall of the reaction tube 203 and the wafers 200 such that the buffer chamber 237 extends upward along the stack direction of the wafers 200 from the lower portion of the inner wall of the reaction tube 203 to the upper portion thereof. Specifically, the buffer chamber 237 (the partition wall 237a) is installed in a region horizontally surrounding the wafer arrangement region in which the wafers 200 are arranged at the lateral side of the wafer arrangement region, along the wafer arrangement region. A gas supply hole 250c for supplying a gas is formed in an end portion of the partition wall 237a which faces (or adjacent to) the wafers 200. The gas supply hole 250c is opened toward the center of the reaction tube 203 to allow the gas to be supplied toward the wafers 200. A plurality of gas supply holes 250c may be formed between the lower portion of the reaction tube 203 and the upper portion thereof. The plurality of gas supply holes 250c may be formed to have the same aperture area at the same aperture pitch.

The nozzle 249b is installed at an end portion of the buffer chamber 237, which is located on the opposite side of the end portion which the gas supply hole 250c is formed, so as to extend upward along the stack direction of the wafers 200 from the lower portion of the inner wall of the reaction tube 203 to the upper portion thereof. Specifically, the nozzle 249b is installed in a region horizontally surrounding the wafer arrangement region in which the wafers 200 are arranged at the lateral side of the wafer arrangement region, along the wafer arrangement region. That is to say, the nozzle 249b is installed in a perpendicular relationship with the surfaces of the wafers 200 at the lateral side of the end portions of the wafers 200, which are carried into the process chamber 201. The nozzle 249b is configured as an L-shaped nozzle. A horizontal portion of the nozzle 249b is installed to penetrate the sidewall of the manifold 209. A vertical portion of the nozzle 249b is installed to extend upward at least from one end portion of the wafer arrangement region toward the other end portion thereof. A gas supply hole 250b for supplying a gas is formed on the side surface of the nozzle 249b. The gas supply hole 250b is opened toward the center of the buffer chamber 237. Like the gas supply hole 250c, a plurality of gas supply holes 250b may be formed between the lower portion of the reaction tube 203 and the upper portion thereof. If a difference between the internal pressure of the buffer chamber 237 and the internal pressure of the process chamber 201 is small, the plurality of gas supply holes 250b may be formed to have the same aperture area at the same aperture pitch over a range from the upstream side (lower portion) to the downstream side (upper portion). If the difference between the internal pressure of the buffer chamber 237 and the internal pressure of the process chamber 201 is large, the plurality of gas supply holes 250b may be formed to have an aperture area which gradually increases from the upstream side to the downstream side or may be formed to have an aperture pitch which gradually decreases from the upstream side to the downstream side.

By adjusting the aperture area and the aperture pitch of each of the gas supply holes 250b over a range from the upstream side to the downstream side as described above, it is possible to eject a gas with substantially the same flow rate from the gas supply holes 250b although it has a difference in flow velocity. Then, once by introducing the gas, which is ejected from the gas supply holes 250b into the buffer chamber 237, it is possible to eliminate a difference in gas flow velocity in the buffer chamber 237. The gas ejected from the gas supply holes 250b into the buffer chamber 237 is mitigated in terms of its particle velocity in the buffer chamber 237 and then is ejected into the process chamber 201 through the gas supply holes 250c. The gas ejected from the gas supply holes 250b into the buffer chamber 237 has a uniform flow rate and flow velocity when it is ejected into the buffer chamber 237 through the gas supply holes 250c.

As described above, in this embodiment, a gas is transferred through the nozzles 249a and 249b and the buffer chamber 237, which are disposed in the vertically-elongated annular space (when viewed from top), i.e., a cylindrical space, defined by the inner surface of the side wall of the reaction tube 203 and the end portions (peripheral edge portions) of the wafers 200 arranged in the reaction tube 203. The gas is initially injected into the reaction tube 203, near the wafers 200, through the gas supply holes 250a to 250c formed respectively in the nozzles 249a and 249b and the buffer chamber 237. Accordingly, the gas supplied to the reaction tube 203 mainly flows in the reaction tube 203 in a direction parallel to surfaces of the wafers 200, i.e., in a horizontal direction. With this configuration, the gas can be uniformly supplied to the respective wafers 200. This makes it possible to improve in-plane film thickness uniformity of a film formed on each of the wafers 200. In addition, the gas flowing on the surfaces of the wafers 200 after reaction, i.e., a residual gas remaining after reaction, flows toward an exhaust port, i.e., an exhaust pipe 231 which will be described later. The flow direction of the residual gas is not limited to a vertical direction but may be appropriately varied depending on a position of the exhaust port.

A precursor gas including silicon (Si) as a predetermined element, for example, a halosilane precursor gas, is supplied from the gas supply pipe 232a to the process chamber 201 via the MFC 241a, the valve 243a and the nozzle 249a.

The precursor gas refers to a gaseous precursor, for example, a gas obtained by vaporizing a precursor which remains in a liquid state under room temperature and atmospheric pressure, or a precursor which remains in a gas state under room temperature and atmospheric pressure. When the term "precursor" is used herein, it may refer to "a liquid precursor staying in a liquid state," "a precursor gas staying in a gaseous state," or both. The halosilane precursor refers to a silane precursor having a halogen element. The halogen element includes at least one selected from a group consisting of chlorine (Cl), a fluorine (F), a bromine (Br) and iodine (I). That is to say, the halosilane precursor includes at least one halogen group selected from a group consisting of a chloro group, a fluoro group, a bromo group and an iodine group.

The halosilane precursor may be said to be one kind of halide. As the halosilane precursor gas, it may be possible to use, e.g., a precursor gas containing Si and Cl, namely, a chlorosilane precursor gas. As the chlorosilane precursor gas, it may be possible to use, e.g., a hexachlorodisilane ($Si_2Cl_6$, abbreviation: HCDS) gas. In the case of using a liquid precursor, such as HCDS, which stays in a liquid state under room temperature and atmospheric pressure, the liquid precursor is vaporized by a vaporization system such as a vaporizer or a bubbler and is supplied as a precursor gas (a HCDS gas).

A first reactant differing in chemical structure (molecular structure) from the precursor, for example, a nitrogen (N), carbon (C) and hydrogen (H)-containing gas, is supplied from the gas supply pipe 232b to the process chamber 201 via the WC 241b, the valve 243b, the nozzle 249b and the buffer chamber 237.

The amine-based gas is a gaseous amine gas, e.g., a gas which is obtained by vaporizing amine which is in a liquid state under room temperature and atmospheric pressure or a gas which contains an amine group such as amine or the like staying in a gaseous state under room temperature and atmospheric pressure. The amine-based gas contains amine such as ethylamine, methylamine, propylamine, isopropylamine, butylamine, isobutylamine. As used herein, the term "amine" is a generic name of compounds in which hydrogen (H) of ammonia ($NH_3$) is substituted with a hydrocarbon group such as an alkyl group. Amine contains a hydrocarbon group such as an alkyl group or the like as a ligand containing C, namely an organic ligand. The amine-based gas may be referred to as a Si-free gas since it contains three elements N, C, and H while not containing Si. The amine-based gas may also be referred to as a Si-free and metal-free gas since it does not contain Si and metal. Namely, the amine-based gas may be a substance consisting of only three elements N, C and H. The amine-based gas acts as a N source and as a C source in a film forming process, which will be described later.

As the amine-based gas, it may be possible to use, e.g., a triethylamine (($C_2H_5)_3N$, abbreviation: TEA) gas, in which the number of C-containing ligands (ethyl groups) in the chemical structural formula (in one molecule) is two or more and the number of C atoms in one molecule is larger than the number of N atoms. In the case of using amine such as TEA which is in a liquid state under room temperature and atmospheric pressure, the amine in a liquid state is vaporized by a vaporization system such as a vaporizer or a bubbler, and is supplied as an amine-based gas (a TEA gas).

A second reactant differing in chemical structure from the precursor, for example, an oxygen (O)-containing gas, is supplied from the gas supply pipe 232b to the process chamber 201 via the MFC 241b, the valve 243b, the nozzle 249b and the buffer chamber 237. The O-containing gas acts as an oxidizing gas, namely, an O source, in the film forming process which will be described later. As the O-containing gas, it may be possible to use, e.g., an oxygen ($O_2$) gas.

An inert gas, for example, a $N_2$ gas, is supplied from the gas supply pipes 232c and 232d to the process chamber 201 via the MFCs 241c and 241d, the valves 243c and 243d, the gas supply pipes 232a and 232b, the nozzles 249a and 249b, and the buffer chamber 237.

In the case of supplying the above-mentioned precursor from the gas supply pipe 232a, a precursor supply system is mainly configured by the gas supply pipe 232a, the MFC 241a, and the valve 243a. The precursor supply system may also include the nozzle 249a. The precursor supply system may be referred to as a precursor gas supply system. In the case of supplying a halosilane precursor as the precursor, the precursor supply system may be referred to as a halosilane precursor supply system or a halosilane precursor gas supply system.

In the case of supplying the above-mentioned first reactant from the gas supply pipe 232b, a first reactant supply system is mainly configured by the gas supply pipe 232b, the MFC 241b, and the valve 243b. The first reactant supply system may also include the nozzle 249b and the buffer chamber 237. In the case of supplying an amine-based gas as the first reactant, the first reactant supply system may be referred to as an amine supply system or an amine-based gas supply system.

In the case of supplying the above-mentioned second reactant from the gas supply pipe 232b, a second reactant supply system is mainly configured by the gas supply pipe 232b, the MFC 241b, and the valve 243b. The second reactant supply system may also include the nozzle 249b and the buffer chamber 237. In the case of supplying an O-containing gas as the second reactant, the second reactant supply system may be referred to as an O-containing gas supply system or an oxidizer supply system.

Furthermore, an inert gas supply system is mainly configured by the gas supply pipes 232c and 232d, the MFCs 241c and 241d, and the valves 243c and 243d.

Figure 2:
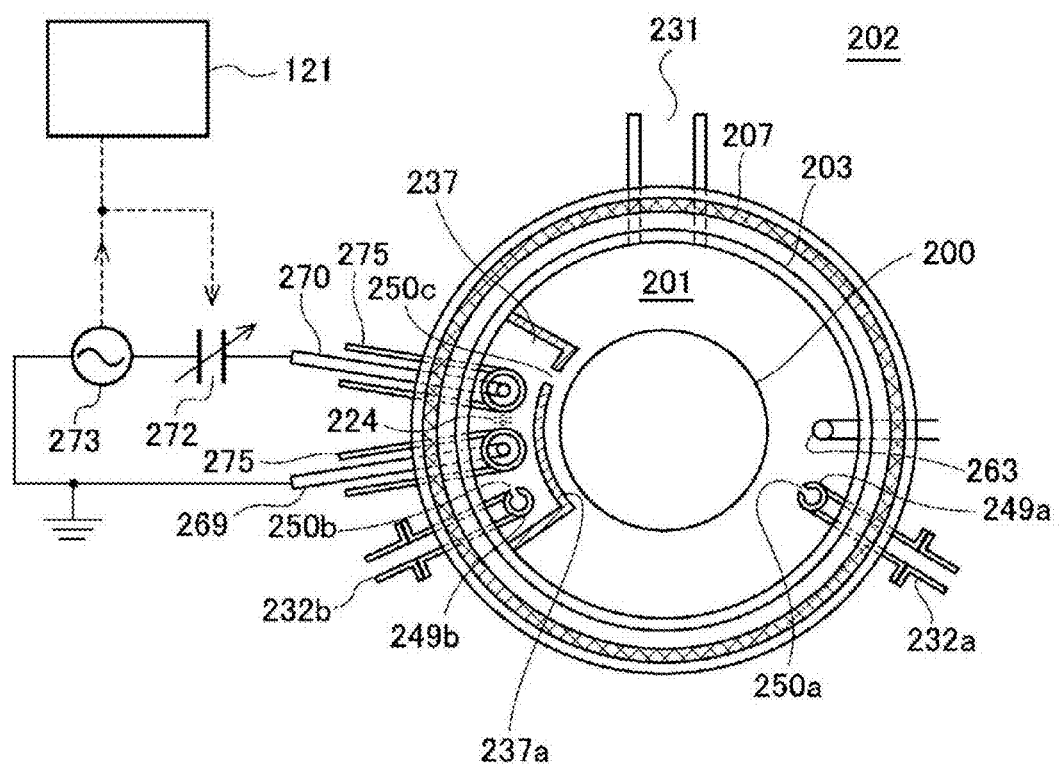
FIG. 2 is a schematic configuration view of the vertical processing furnace of the substrate processing apparatus suitably used in an embodiment of the present disclosure, in which a portion of the processing furnace is shown in a cross section taken along line II-II in FIG. 1.

In the buffer chamber 237, as illustrated in FIG. 2, two rod-shaped electrodes 269 and 270, which are made of a conductor and have an elongated structure, are disposed along the arrangement direction of the wafers 200 to span from the lower portion of the reaction tube 203 to the upper portion thereof. Each of the rod-shaped electrodes 269 and 270 is installed parallel to the nozzle 249b. Each of the rod-shaped electrodes 269 and 270 is covered with and protected by an electrode protection tube 275 over a region spanning from an upper portion to a lower portion thereof. One of the rod-shaped electrodes 269 and 270 is connected to a high-frequency power source 273 via a matcher 272, and the other is connected to ground having a reference electric potential. By applying high-frequency (RF) power from the high-frequency power source 273 between the rod-shaped electrodes 269 and 270, plasma is generated in a plasma generation region 224 between the rod-shaped electrodes 269 and 270. A plasma source as a plasma generator (plasma generating unit) is mainly configured by the rod-shaped electrodes 269 and 270 and the electrode protection tubes 275. The matcher 272 and the high-frequency power source 273 may also be included in the plasma source. As will be described later, the plasma source functions as a plasma exciting unit (an activating mechanism) that plasma-excites a gas, namely, excites (activates) a gas into a plasma state.

Each of the electrode protection tubes 275 has a structure in which each of the rod-shaped electrodes 269 and 270 can be inserted into the buffer chamber 237 while keeping each of the rod-shaped electrodes 269 and 270 isolated from the internal atmosphere of the buffer chamber 237. If an oxygen (O) concentration within each of the electrode protection tubes 275 is substantially equal to an O concentration in ambient air (atmosphere), each of the rod-shaped electrodes 269 and 270 inserted into the electrode protection tubes 275 may be oxidized by the heat generated from the heater 207. By charging the interior of the electrode protection tubes 275 with an inert gas such as a $N_2$ gas or the like, or by purging the interior of the electrode protection tubes 275 with an inert gas such as an $N_2$ gas or the like through the use of an inert gas purge mechanism, it is possible to reduce the O concentration within the electrode protection tubes 275, thereby preventing oxidation of the rod-shaped electrodes 269 and 270.

An exhaust pipe 231 as an exhaust passage for exhausting an internal atmosphere of the process chamber 201 is installed in the reaction tube 203. A vacuum exhaust device, e.g., a vacuum pump 246, is connected to the exhaust pipe 231 via a pressure sensor 245, which is a pressure detector (pressure detecting part) for detecting an internal pressure of the process chamber 201, and an auto pressure controller (APC) valve 244, which is an exhaust valve (pressure regulating part). The APC valve 244 is configured to perform or stop vacuum exhaust in the process chamber 201 by opening or closing the valve while the vacuum pump 246 is actuated and is also configured to regulate the internal pressure of the process chamber 201 by adjusting an opening degree of the valve pursuant to pressure information detected by the pressure sensor 245 while the vacuum pump 246 is actuated. An exhaust system is mainly configured by the exhaust pipe 231, the APC valve 244, and the pressure sensor 245. The vacuum pump 246 may be included in the exhaust system. The exhaust pipe 231 is not limited to be installed in the reaction tube 203 but may be installed in the manifold 209, like the nozzles 249a and 249b.

A seal cap 219, which serves as a furnace opening cover configured to hermetically seal a lower end opening of the reaction tube 203, is installed under the manifold 209. The seal cap 219 is configured to make contact with the lower end of the manifold 209 at a lower side in the vertical direction. The seal cap 219 is made of metal such as, e.g., stainless steel or the like, and is formed in a disc shape. An O-ring 220b, which is a seal member making contact with the lower end portion of the manifold 209, is installed on an upper surface of the seal cap 219. A rotation mechanism 267 configured to rotate a boat 217, which will be described later, is installed at the opposite side of the seal cap 219 from the process chamber 201. A rotary shaft 255 of the rotation mechanism 267, which penetrates through the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism vertically installed outside the reaction tube 203. The boat elevator 215 is configured to load and unload the boat 217 into and from the process chamber 201 by moving the seal cap 219 up and down. The boat elevator 115 is configured as a transfer device (transfer mechanism) which transfers the boat 217, i.e., the wafers 200, into and out of the process chamber 201. In addition, a shutter 219s, which serves as a furnace opening cover configured to hermetically seal a lower end opening of the manifold 209 while the seal cap 219 is lowered by the boat elevator 115, is installed under the manifold 209. The shutter 219s is made of metal such as, e.g., stainless steel or the like, and is formed in a disc shape. An O-ring 220c, which is a seal member making contact with the lower end portion of the manifold 209, is installed on an upper surface of the shutter 219s. The opening/closing operation (such as elevation operation, rotation operation or the like) of the shutter 219s is controlled by a shutter opening/closing mechanism 115s.

The boat 217 serving as a substrate support is configured to support a plurality of wafers 200, e.g., 25 to 200 wafers, in such a state that the wafers 200 are arranged in a horizontal posture and in multiple stages along a vertical direction with the centers of the wafers 200 aligned with one another. That is to say, the boat 217 is configured to arrange the wafers 200 in a spaced-apart relationship. The boat 217 is made of a heat resistant material such as quartz or SiC. Heat insulating plates 218 made of a heat resistant material such as quartz or SiC are installed below the boat 217 in multiple stages. With this configuration, it is hard for heat generated from the heater 207 to be transferred to the seal cap 219. However, the present embodiment is not limited to the above-described configuration. For example, instead of installing the heat insulating plates 218 below the boat 217, a heat insulating tube as a tubular member made of a heat resistant material such as quartz or SiC may be installed below the boat 217.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. Similar to the nozzles 249a and 249b, the temperature sensor 263 is formed in an L-shape. The temperature sensor 263 is installed along the inner wall of the reaction tube 203.

Figure 3:
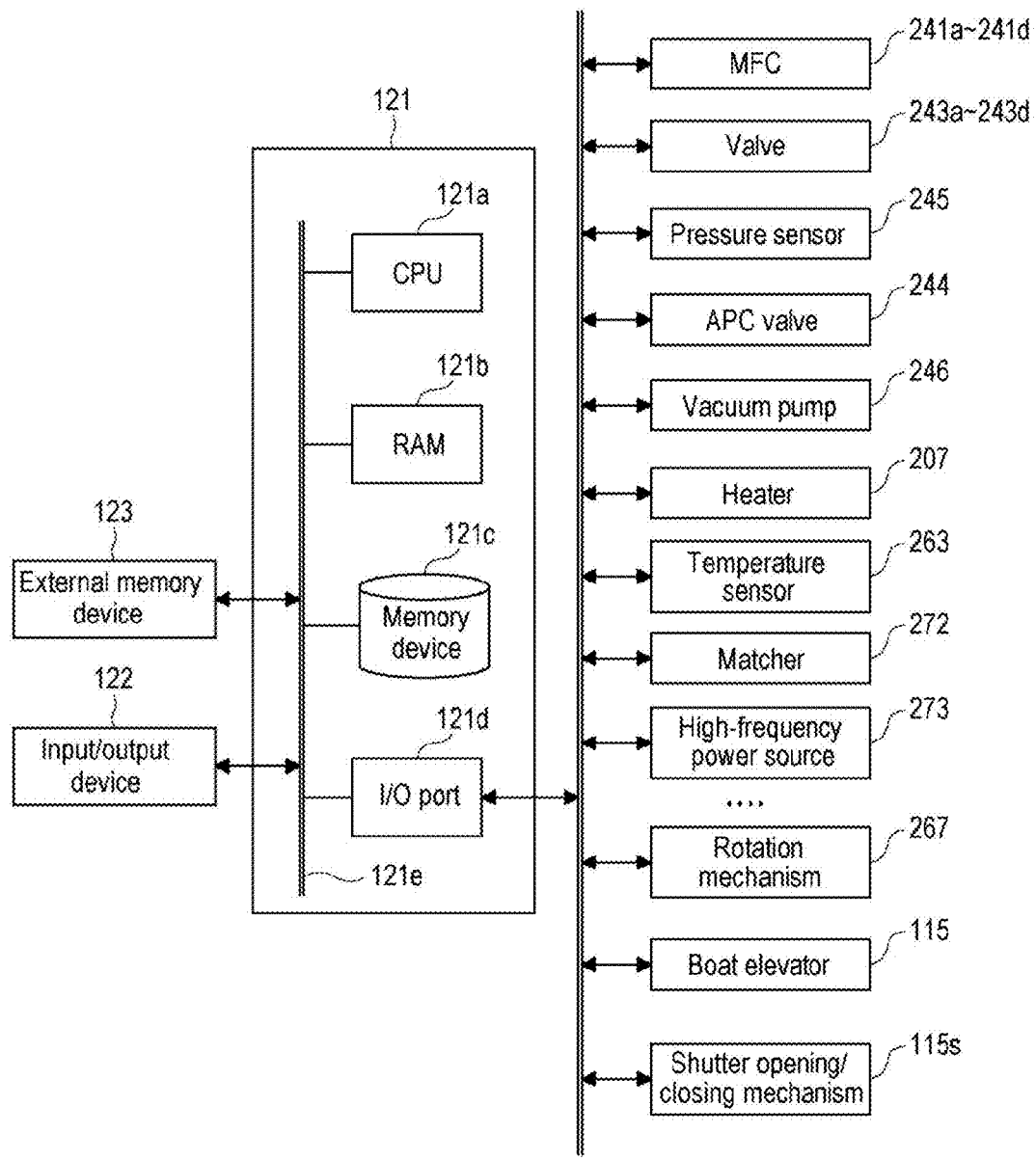
FIG. 3 is a schematic configuration diagram of a controller of the substrate processing apparatus suitably used in an embodiment of the present disclosure, in which a control system of the controller is shown in a block diagram.

As illustrated in FIG. 3, a controller 121, which is a control part (control means), may be configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122 formed of, e.g., a touch panel or the like, is connected to the controller 121.

The memory device 121c is configured with, for example, a flash memory, a hard disc drive (HDD), or the like. A control program for controlling operations of a substrate processing apparatus and a process recipe, in which sequences and conditions of a film forming process to be described later are written, are readably stored in the memory device 121c. The process recipe function as a program for causing the controller 121 to execute each sequence in the film forming process, which will be described later, to obtain a predetermined result. Hereinafter, the process recipe and the control program will be generally and simply referred to as a "program". Furthermore, the process recipe will be simply referred to as a "recipe". When the term "program" is used herein, it may indicate a case of including only the recipe, a case of including only the control program, or a case of including both the recipe and the control program. In addition, the RAM 121b is configured as a memory area (work area) in which a program or data read by the CPU 121a is temporarily stored.

The I/O port 121d is connected to the MFCs 241a to 241d, the valves 243a to 243d, the pressure sensor 245, the APC valve 244, the vacuum pump 246, the temperature sensor 263, the heater 207, the rotation mechanism 267, the boat elevator 115, the shutter opening/closing mechanism 115s, the matcher 272, the high-frequency power source 273, and the like.

The CPU 121a is configured to read and execute the control program from the memory device 121c. The CPU 121a also reads the recipe from the memory device 121c according to an input of an operation command from the input/output device 122. In addition, the CPU 121a is configured to control the flow rate adjusting operation of various kinds of gases by the MFCs 241a to 241d, the opening/closing operation of the valves 243a to 243d, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 263, the operation of rotating the boat 217 with the rotation mechanism 267 and adjusting the rotation speed of the boat 217, the operation of moving the boat 217 up and down with the boat elevator 115, the opening/closing operation of the shutter 219s with the shutter opening/closing mechanism 115s, the impedance adjusting operation with the matcher 272, the supply of power to the high-frequency power source 273, and the like, according to contents of the read recipe.

The controller 121 may be configured by installing, on the computer, the aforementioned program stored in an external memory device 123 (for example, a magnetic tape, a magnetic disc such as a flexible disc or a hard disc, an optical disc such as a CD or DVD, a magneto-optical disc such as an MO, a semiconductor memory such as a USB memory or a memory card). The memory device 121c or the external memory device 123 is configured as a non-transitory computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer using communication means such as the Internet or a dedicated line, instead of using the external memory device 123.

(2) Film Forming Process

A sequence example of forming a thin film on a substrate using the aforementioned substrate processing apparatus, which is one of the processes for manufacturing a semiconductor device, will be described below with reference to FIG. 4A. In the following descriptions, the operations of the respective parts constituting the substrate processing apparatus are controlled by the controller 121.

Figure 4A:
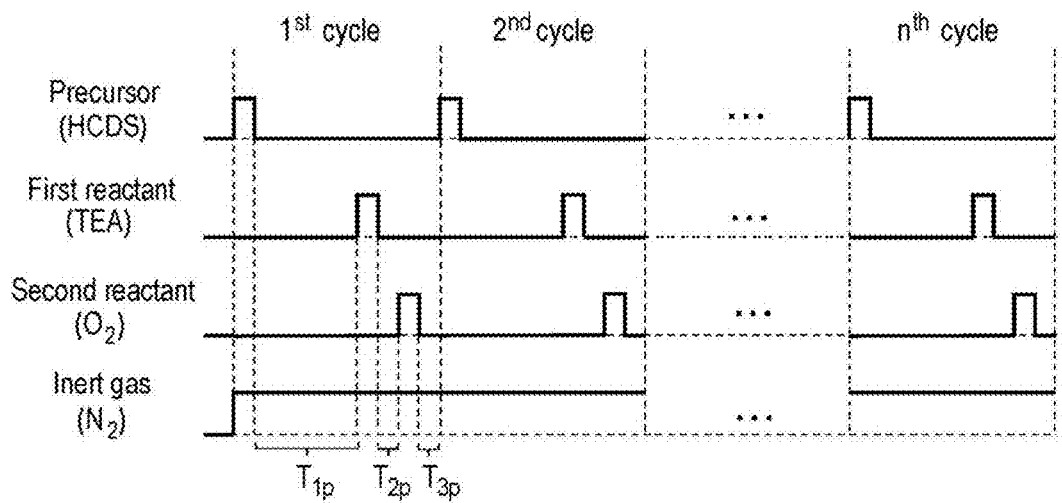
FIG. 4A is a diagram illustrating one example of a film forming sequence according to a first embodiment of the present disclosure.

In the film forming sequence illustrated in FIG. 4A, a silicon oxycarbide film (SiOC film) containing Si, O and C or a silicon oxycarbonitride film (SiOCN film) containing Si, O, C and N is formed on a wafer 200 by performing, a predetermined number of times (n times), a cycle that non-simultaneously performs: a step 1 of supplying a HCDS gas, as a precursor, to the wafer 200 as a substrate in the process chamber 201; a step 1p of removing the HCDS gas out of the process chamber 201; a step 2 of supplying a TEA gas, as a first reactant, to the wafer 200 in the process chamber 201; a step 2p of removing the TEA gas out of the process chamber 201; a step 3 of supplying an $O_2$ gas, as a second reactant, to the wafer 200 in the process chamber 201; and a step 3p of removing the $O_2$ gas out of the process chamber 201.

In the film forming sequence illustrated in FIG. 4A, a time period for performing step 1p of removing the HCDS gas is set to be longer than a time period for performing step 1p of removing the TEA gas, the reason and detailed processing conditions of which will be described later.

In the present disclosure, for the sake of convenience, the film forming sequence illustrated in FIG. 4A may sometimes be denoted as follows. The same denotation will be used in other embodiments.

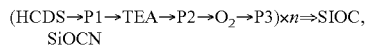
    SiOCN

When the term "wafer" is used in the present disclosure, the wafer may refer to "a wafer itself" or "a wafer and a laminated (aggregated) body of predetermined layers or films formed on a surface of the wafer". That is to say, a wafer including predetermined layers or films formed on its surface may be referred to as a wafer. In addition, when the phrase "a surface of a wafer" is used in the present disclosure, "a surface of a wafer" may refer to "a surface (exposed surface) of a wafer itself" or "a surface of a predetermined layer or film formed on a wafer, namely an uppermost surface of the wafer, which is a laminated body".

Accordingly, in the present disclosure, the expression "a predetermined gas is supplied to a wafer" may mean that "a predetermined gas is directly supplied to a surface (exposed surface) of a wafer itself" or that "a predetermined gas is supplied to a layer or film formed on a wafer, namely on an uppermost surface of a wafer as a laminated body." Furthermore, in the present disclosure, the expression "a predetermined layer (or film) is formed on a wafer" may mean that "a predetermined layer (or film) is directly formed on a surface (exposed surface) of a wafer itself" or that "a predetermined layer (or film) is formed on a layer or film formed on a wafer, namely on an uppermost surface of a wafer as a laminated body."

In addition, when the term "substrate" is used in the present disclosure, the "substrate" may be synonymous with the term "wafer."

(Loading Step)

When a plurality of wafers 200 is charged on the boat 217 (wafer charging), the shutter 219s is moved by the shutter opening/closing mechanism 115s and the lower end opening of the manifold 209 is opened (shutter open). Thereafter, as illustrated in FIG. 1, the boat 217 supporting the plurality of wafers 200 is lifted up by the boat elevator 115 to be loaded into the process chamber 201 (boat loading). In this state, the seal cap 219 seals the lower end of the manifold 209 through the O-ring 220b.

(Pressure and Temperature Adjusting Step)

The interior of the process chamber 201, namely the space in which the wafers 200 exist, is vacuum-exhausted (de-pressurization-exhausted) by the vacuum pump 246 so as to reach a desired pressure (degree of vacuum). In this operation, the internal pressure of the process chamber 201 is measured by the pressure sensor 245. The APC valve 244 is feedback-controlled based on the measured pressure information. The vacuum pump 246 may be continuously activated at least until the processing of the wafers 200 is completed. The wafers 200 in the process chamber 201 are heated by the heater 207 to a desired temperature. In this operation, the state of supplying electric power to the heater 207 is feedback-controlled based on the temperature information detected by the temperature sensor 263 such that the interior of the process chamber 201 has a desired temperature distribution. In addition, the heating of the interior of the process chamber 201 by the heater 207 may be continuously performed at least until the processing of the wafers 200 is completed. The rotation of the boat 217 and the wafers 200 by the rotation mechanism 267 begins. The rotation of the boat 217 and the wafers 200 by the rotation mechanism 267 may be continuously performed at least until the processing of the wafers 200 is completed.

(Film Forming Step)

Next, the above-mentioned steps 1 and 1p, steps 2 and 2p, and steps 3 and 3p are sequentially performed.

[Step 1 (HCDS Gas Supply)]

At this step, a HCDS gas is supplied to the wafer 200 in the process chamber 201.

Specifically, the valve 243a is opened to allow a HCDS gas to flow through the gas supply pipe 232a. A flow rate of the HCDS gas is adjusted by the MFC 241a, and then the HCDS gas is supplied to the process chamber 201 via the nozzle 249a and is exhausted through the exhaust pipe 231. At this time, the HCDS gas is supplied to the wafer 200. At the same time, the valve 243c is opened to allow a $N_2$ gas to flow through the gas supply pipe 232c. A flow rate of the $N_2$ gas is adjusted by the MFC 241c, and the $N_2$ gas is supplied to the process chamber 201 together with the HCDS gas and is exhausted through the exhaust pipe 231. In addition, in order to prevent the HCDS gas from infiltrating into the buffer chamber 237 and the nozzle 249b, the valves 243d are opened to allow the $N_2$ gas to flow through the gas supply pipe 232d. The $N_2$ gas is supplied to the process chamber 201 through the gas supply pipe 232b, the nozzle 249b and the buffer chamber 237 and is exhausted through the exhaust pipe 231.

A supply flow rate of the HCDS gas, which is controlled by the WC 241a, is set to fall within a range of, e.g., 1 to 2,000 sccm, specifically, 10 to 1,000 sccm. Supply flow rates of the $N_2$ gas, which are controlled by the MFCs 241c and 241d, are set to fall within a range of, e.g., 100 to 10,000 sccm. An internal pressure of the process chamber 201 is set to fall within a range of, e.g., 1 to 2,666 Pa, specifically 67 to 1,333 Pa. A time period for supplying the HCDS gas to the wafer 200 is set to fall within a range of, e.g., 1 to 120 seconds, specifically, 1 to 60 seconds.

The temperature of the heater 207 is set such that the temperature of the wafer 200 falls within a range of, e.g., 250 to 700 degrees C.°, specifically 300 to 650 degrees C.°, more specifically 350 to 600 degrees C.°.

If the temperature of the wafer 200 becomes lower than 250 degrees C.°, the HCDS gas is hardly chemisorbed onto the wafer 200. Thus, there may be a case where a practical deposition rate is not obtained. This problem may be solved by setting the temperature of the wafer 200 at 250 degrees C.° or higher. By setting the temperature of the wafer 200 at 300 degrees C.° or higher, ultimately at 350 degrees C.° or higher, it is possible to allow the HCDS gas to be sufficiently adsorbed onto the wafer 200. Thus, a sufficient deposition rate is obtained.

If the temperature of the wafer 200 exceeds 700 degrees C.°, an excessive gas phase reaction is generated. Thus, the film thickness uniformity easily deteriorates and is hardly controlled. By setting the temperature of the wafer 200 at 700 degrees C.° or lower, it is possible to generate a suitable gas phase reaction. This makes it possible to suppress deterioration of the film thickness uniformity and to control the film thickness uniformity. Particularly, if the temperature of the wafer 200 is set at 650 degrees C.° or lower, ultimately at 600 degrees C.° or lower, a surface reaction becomes more dominant than a gas phase reaction. This makes it easy to secure the film thickness uniformity and to control the film thickness uniformity.

Accordingly, the temperature of the wafer 200 may be set to fall within a range of 250 to 700 degrees C.°, specifically 300 to 650 degrees C.°, more specifically 350 to 600 degrees C.°.

By supplying the HCDS gas to the wafer 200 under the aforementioned conditions, a first layer (an initial layer), for example, a Cl- and Si-containing layer having a thickness of less than one atomic layer to several atomic layers, is formed on the uppermost surface of the wafer 200. The Cl- and Si-containing layer may include a Cl-containing Si layer, an adsorption layer of HCDS, or both.

The Cl-containing Si layer is a generic name that encompasses a continuous or discontinuous layer containing Cl, which is composed of Si, and a Si thin film containing Cl, which is formed of the layers overlapping with one another. The continuous layer containing Cl, which is composed of Si, is sometimes referred to as a Si thin film containing Cl. The Si which constitutes the Si layer containing Cl includes not only Si whose bond to Cl is not completely broken, but also Si whose bond to Cl is completely broken.

The adsorption layer of HCDS includes not only a continuous adsorption layer composed of HCDS molecules but also a discontinuous adsorption layer. That is to say, the adsorption layer of HCDS includes an adsorption layer having a thickness of one molecular layer or less than one molecular layer, which is composed of HCDS molecules. The HCDS molecules that constitute the adsorption layer of HCDS include a molecule in which Si—Cl bonds are partially broken. That is to say, the adsorption layer of HCDS may include a physical adsorption layer of HCDS, a chemisorption layer of HCDS, or both.

In this regard, the layer having a thickness of less than one atomic layer may mean an atomic layer that is discontinuously formed. The layer having a thickness of one atomic layer may mean an atomic layer that is continuously formed. The layer having a thickness of less than one molecular layer may mean a molecular layer that is discontinuously formed. The layer having a thickness of one molecular layer may mean a molecular layer that is continuously formed. The Si-containing layer containing Cl may include both a Si layer containing Cl and an adsorption layer of HCDS. As described above, expressions such as "one atomic layer", "several atomic layers" and the like will be used with respect to the Cl- and Si-containing layer.

Under a condition in which the HCDS gas is autolyzed (or pyrolyzed), i.e., a condition in which a pyrolysis reaction of the HCDS gas is generated, Si is deposited on the wafer 200 to form a Si layer containing Cl. Under a condition in which the HCDS gas is not autolyzed (or pyrolyzed), i.e., a condition in which a pyrolysis reaction of the HCDS gas is not generated, HCDS is adsorbed onto the wafer 200 to form an adsorption layer of HCDS. From the viewpoint of increasing the deposition rate, it may be more advantageous to form the Si layer containing Cl on the wafer 200 than to form the adsorption layer of HCDS on the wafer 200. Hereinafter, for the sake of convenience, the Si layer containing Cl will be sometimes simply referred to as a Si-containing layer.

If the thickness of the first layer exceeds several atomic layers, a modifying reaction at steps 2 and 3, which will be described later, does not affect the entire first layer. In addition, a minimum value of the thickness of the first layer is less than one atomic layer. Accordingly, the thickness of the first layer may be set to fall within a range of less than one atomic layer to several atomic layers. By setting the thickness of the first layer to become one atomic layer or less, namely one atomic layer or less than one atomic layer, it is possible to relatively increase the modifying reaction at steps 2 and 3 which will be described later and to shorten the time required for the modifying reaction at steps 2 and 3. It is also possible to shorten the time required for formation of the first layer at step 1. Consequently, it is possible to shorten the processing time per one cycle. This makes it possible to shorten the total processing time. That is to say, it is possible to increase the deposition rate. Furthermore, by setting the thickness of the first layer to become one atomic layer or less, it is possible to enhance the controllability of the film thickness uniformity.

As the precursor gas, in addition to the HCDS gas, it may be possible to use, e.g., an inorganic halosilane precursor gas such as a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane, i.e., silicon tetrachloride ($SiCl_4$, abbreviation: STC) gas, or a octachlorosilane ($Si_3Cl_8$, abbreviation: OCTS) gas.

As the precursor gas, it may also be possible to use an alkylenehalosilane precursor gas such as an ethylene bis(trichlorosilane) gas, namely a 1,2-bis(trichlorosilyl)ethane (($SiCl_3)_2C_2H_4$, abbreviation: BTCSE) gas, or a methylene bis(trichlorosilane) gas, namely a bis(trichlorosilyl)methane (($SiCl_3)_2CH_2$, abbreviation: BTCSM) gas.

As the precursor gas, it may also be possible to use an alkylhalosilane precursor gas such as a 1,1,2,2-tetrachloro-1,2-dimethyldisilane (($CH_3)_2Si_2Cl_4$, abbreviation: TCDMDS) gas, a 1,2-dichloro-1,1,2,2-tetramethyldisilane (($CH_3)_4Si_2Cl_2$, abbreviation: DCTMDS) gas, or a 1-monochloro-1,1,2,2,2-pentamethyldisilane (($CH_3)_5Si_2Cl$, abbreviation: MCPMDS) gas.

As the precursor gas, it may also be possible to use an inorganic precursor gas such as a monosilane ($SiH_4$, abbreviation: MS) gas, a disilane ($Si_2H_6$, abbreviation: DS) gas, or a trisilane ($Si_3H_8$, abbreviation: TS) gas.

As the precursor gas, it may also be possible to use a aminosilane precursor gas such as a tetrakisdimethylaminosilane ($Si[N(CH_3)_2]_4$, abbreviation: 4DMAS) gas, a trisdimethylaminosilane ($Si[N(CH_3)_2]_3H$, abbreviation: 3DMAS) gas, a bisdiethylaminosilane ($Si[N(C_2H_5)_2]_2H_2$, abbreviation: BDEAS) gas, or a bis-tert-butylaminosilane ($SiH_2[NH(C_4H_9)]_2$, abbreviation: BTBAS) gas.

[Step 1p (HCDS Gas Removal)]

After the first layer (the Cl- and Si-containing layer) is formed, the valve 243a is closed to stop the supply of the HCDS gas. At this time, the interior of the process chamber 201 is vacuum-exhausted by the vacuum pump 246 while opening the APC valve 244. Thus, the HCDS gas remaining in the process chamber 201, which has not reacted or which has contributed to the formation of the first layer, is discharged (i.e., removed) from the interior of the process chamber 201. At this time, the supply of the $N_2$ gas to the process chamber 201 may be maintained while opening the valves 243c and 243d. The $N_2$ gas acts as a purge gas. This makes it possible to enhance the effect of discharging the gas remaining in the process chamber 201 from the interior of the process chamber 201.

As the purge gas, in addition to the $N_2$ gas, it may be possible to use, e.g., a rare gas such as an Ar gas, a He gas, a Ne gas, a Xe gas or the like.

[Step 2 (TEA Gas Supply)]

After step 1p is completed, a TEA gas is supplied to the wafer 200 in the process chamber 201, namely the first layer (the Cl- and Si-containing layer) formed on the wafer 200.

At this step, the opening/closing control of the valves 243b to 243d is performed in the same procedure as the opening/closing control of the valves 243a, 243c and 243d performed at step 1. The flow rate of the TEA gas is adjusted by the MFC 241b and then the TEA gas is supplied to the process chamber 201 via the nozzle 249b and the buffer chamber 237 and is exhausted through the exhaust pipe 231. At this time, the TEA gas is supplied to the wafer 200.

The supply flow rate of the TEA gas controlled by the MFC 241b is set to fall within a range of, e.g., 100 to 10,000 sccm. The internal pressure of the process chamber 201 is set to fall within a range of, e.g., 1 to 5,000 Pa, specifically 1 to 4,000 Pa. By setting the internal pressure of the process chamber 201 to fall within such a relatively high pressure zone, it is possible to thermally activate the TEA gas in a non-plasma manner. If the TEA gas is supplied by thermally activating the same, it is possible to generate a relatively soft reaction. This makes it easy to form a second layer (SiCN layer) which will be described later. A time period for supplying the TEA gas to the wafer 200 is set to fall within a range of, e.g., 1 to 200 seconds, specifically, 1 to 120 seconds, more specifically 1 to 60 seconds. Other processing conditions may be similar to, e.g., the processing conditions of step 1.

As the TEA gas is supplied to the wafer 200 under the above-described conditions, the first layer (the Cl- and Si-containing layer) formed on the wafer 200 in step 1 can react with the TEA gas. That is, Cl (chloro group) which is the halogen element (halogen group) contained in the first layer can react with ligands (ethyl group) contained in the TEA gas. Accordingly, at least a portion of Cl contained in the first layer can be extracted (separated) from the first layer, and at least a portion of a plurality of ethyl groups contained in the TEA gas can be separated from the TEA gas. Then, N contained in the TEA gas where at least a portion of the ethyl groups is separated can be bonded to Si contained in the first layer. That is, N, which constitutes the TEA gas and has a dangling bond due to removal of at least a portion of the ethyl groups, can be bonded to Si, which is contained in the first layer to have a dangling bond, or Si, which has had a dangling bond, thereby enabling bonding of Si and N to be formed. At this time, C contained in the ethyl group (—$CH_2CH_3$) separated from the TEA gas and Si contained in the first layer can be bonded to each other to form bonding of Si and C. As a result, Cl is desorbed from the first layer and a N component is newly introduced into the initial layer. Here, a C component is also newly introduced into the first layer.

As the TEA gas is supplied under the above-described conditions, since the first layer can appropriately react with the TEA gas, it is possible to cause the sequence of the above-described reactions. In addition, the sequence of these reactions causes Cl to be desorbed from the first layer and the N and C components to be newly introduced into the first layer, such that the first layer is changed (modified) into a layer containing Si, N and C, i.e., a silicon carbonitride layer (SiCN layer) as a second layer. The second layer becomes a layer having a thickness of less than one atomic layer to several atomic layers. In addition, the second layer becomes a layer having a relatively high Si and C component ratio, i.e., a Si- and C-rich layer.

When the second layer is formed, Cl contained in the first layer or H contained in the TEA gas constitutes a substance in a gaseous state containing at least any one of Cl and H in a modification reaction procedure of the first layer by the TEA gas, and exhausted out of the process chamber 201 through the exhaust pipe 231. That is, impurities such as Cl contained in the first layer are extracted or desorbed from the first layer, thereby being separated from the first layer. Accordingly, the second layer has fewer impurities such as Cl than the first layer.

As the amine-based gas, in addition to the TEA gas, it may be possible to use, e.g., an ethylamine-based gas such as a diethylamine (($C_2H_5)_2$NH, abbreviation: DEA) gas, or a monoethylamine ($C_2H_5NH_2$, abbreviation: MEA) gas, a methylamine-based gas such as a trimethylamine (($CH_3)_3$N, abbreviation: TMA) gas, or a dimethylamine (($CH_3)_2$NH, abbreviation: DMA) gas, a monomethylamine ($CH_3NH_2$, abbreviation: MMA) gas, a propylamine-based gas such as a tripropylamine (($C_3H_7)_3$N, abbreviation: TPA) gas, a dipropylamine (($C_3H_7)_2$NH, abbreviation: DPA) gas, or a monopropylamine ($C_3H_7NH_2$, abbreviation: MPA) gas, an isopropylamine-based gas such as a triisopropylamine ($[(CH_3)_2CH]_3$N, abbreviation: TIPA) gas, a diisopropylamine ($[(CH_3)_2CH]_2$NH, abbreviation: DIPA) gas, or a monoisopropylamine (($CH_3)_2CHNH_2$, abbreviation: MIPA) gas, a butylamine-based gas such as a tributylamine (($C_4H_9)_3$ N, abbreviation: TBA) gas, a dibutylamine (($C_4H_9)_2$ NH, abbreviation: DBA) gas, or a monobutylamine ($C_4H_9NH_2$, abbreviation: MBA) gas, or an isobutylamine-based gas such as a triisobutylamine ($[(CH_3)_2CHCH_2]_3$N, abbreviation: TIBA) gas, a diisobutylamine ($[(CH_3)_2CHCH_2]_2$NH, abbreviation: DIBA) gas, or a monoisobutylamine (($CH_3)_2$ $CHCH_2NH_2$, abbreviation: MBA) gas.

That is, the amine-based gas may include, for example, at least one type of gas among $(C_2H_5)_xNH_{3-x}$, $(CH_3)_xNH_{3-x}$, $(C_3H_7)_xNH_{3-x}$, $[(CH_3)_2CH]_xNH_{3-x}$, $(C_4H_9)_xNH_{3-x}$, and $[(CH_3)_2CHCH_2]_xNH_{3-x}$ (x is an integer number of 1 to 3 in the chemical formulae).

[Step 2p (TEA Gas Removal)]

After the second layer (the SiCN layer) is formed, the valve 243b is closed to stop the supply of the TEA gas. According to the processing procedure similar to that of step 1p, the TEA gas remaining in the process chamber 201, which has not reacted or which has contributed to the formation of the second layer, and the reaction byproducts remaining in the process chamber 201 are discharged (i.e., removed) from the interior of the process chamber 201.

However, the processing conditions of step 2p are different from the processing conditions of step 1p, which will be described in detail later.

[Step 3 ($O_2$ Gas Supply)]

After step 2p is completed, an $O_2$ gas is supplied to the wafer 200 in the process chamber 201, namely the second layer (the SiCN layer) formed on the wafer 200.

At this step, the opening/closing control of the valves 243b to 243d is performed in the same procedure as the opening/closing control of the valves 243a, 243c and 243d performed at step 1. The flow rate of the $O_2$ gas is adjusted by the MFC 241b and then the $O_2$ gas is supplied to the process chamber 201 via the nozzle 249b and the buffer chamber 237 and is exhausted through the exhaust pipe 231. At this time, the $O_2$ gas is supplied to the wafer 200.

The supply flow rate of the $O_2$ gas controlled by the MFC 241b is set to fall within a range of, e.g., 1,000 to 10,000 sccm. The internal pressure of the process chamber 201 is set to fall within a range of, e.g., 1 to 4,000 Pa, specifically 1 to 3,000 Pa. By setting the internal pressure of the process chamber 201 to fall within such a relatively high pressure zone, it is possible to thermally activate the $O_2$ gas in a non-plasma manner. If the $O_2$ gas is supplied by thermally activating the same, it is possible to generate a relatively soft reaction. This makes it possible to softly perform an oxidation which will be described later. A time period for supplying the $O_2$ gas to the wafer 200 is set to fall within a range of, e.g., 1 to 120 seconds, specifically 1 to 60 seconds. Other processing conditions may be similar to, e.g., the processing conditions of step 1.

At this time, the gas flowing into the process chamber 201 is a thermally-activated $O_2$ gas. The HCDS gas and the TEA gas do not flow into the process chamber 201. Accordingly, the $O_2$ gas does not make a gas phase reaction and is supplied to the wafer 200 in an activated state. The $O_2$ gas supplied to the wafer 200 reacts with at least a portion of the second layer (the SiCN layer) formed on the wafer 200. Then, due to a thermal oxidation reaction by the O2 gas, an O component is added to the second layer, thereby increasing a Si—O bond in the second layer while decreasing a Si—N bond and a Si—C bond. That is to say, while the O component is added to the second layer, a percentage of N component and C component in the second layer decreases. In addition, a C component in the second component, which is formed by performing steps 1 and 2, is richer than the N component. Therefore, by performing an oxidation process until the N component is completely desorbed from the second layer in step 3, it is possible to change (modify) the second layer into a silicon oxycarbide layer (N-free SiOC layer) containing Si, O and C. In addition, by stopping the oxidation process before the N component is completely desorbed from the second layer in step 3, it is possible to change the second layer into a silicon oxycarbonitride layer (SiOCN layer) containing Si, O, C and N. Hereinafter, a layer (SiOC layer or SiOCN layer) obtained by modifying the second layer will be referred to as a third layer. The SiOCN layer may be referred to as a N-containing SiOC layer.

When forming the third layer, the impurities such as Cl and the like contained in the second layer make up a gaseous material containing at least Cl in the course of the modifying reaction caused by the $O_2$ gas. The gaseous material is discharged from the interior of the process chamber 201. That is to say, the impurities such as Cl and the like contained in the second layer are extracted or desorbed from the second layer and are separated from the second layer. Thus, the third layer becomes a layer containing fewer impurities, such as Cl and the like, than the second layer.

As the O-containing gas, in addition to the $O_2$ gas, it may be possible to use water vapor ($H_2O$ gas), nitric monoxide (NO) gas, nitrous oxide ($N_2O$) gas, nitrogen dioxide ($NO_2$) gas, carbon monoxide (CO) gas, carbon dioxide ($CO_2$) gas, ozone ($O_3$) gas, a mixture of hydrogen ($H_2$) gas and $O_2$ gas, a mixture of $H_2$ gas and $O_3$ gas, or the like.

[Step 3p ($O_2$ Gas Removal)]

After the third layer (the SiOC layer or the SiOCN layer) is formed, the valve 243b is closed to stop the supply of the $O_2$ gas. According to the processing procedure similar to that of step 1p, the $O_2$ gas remaining in the process chamber 201, which has not reacted or which has contributed to the formation of the third layer, and the reaction byproducts remaining in the process chamber 201 are discharged (i.e., removed) from the interior of the process chamber 201.

However, the processing conditions of step 3p are different from the processing conditions of step 1p, which will be described in detail later.

(Performing a Predetermined Number of Times)

The cycle which non-simultaneously, i.e., non-synchronously, performs the above-described six steps is performed a predetermined number of times (n times) to thereby form a SiOC film or a SiOCN film having a predetermined composition and a predetermined thickness on the wafer 200. The above cycle may be repeated multiple times. That is to say, the thickness of the third layer (SiOC layer or SiOCN layer) formed when performing the aforementioned cycle once may be set to become smaller than a desired film thickness. Thus, the above cycle may be repeated multiple times until the film thickness of a film formed by laminating the third layers becomes equal to the desired film thickness.

(Atmospheric Pressure Returning Step)

After the film forming step is completed, the $N_2$ gas is supplied to the process chamber 201 from each of the gas supply pipes 232c and 232d, and is exhausted through the exhaust pipe 231. The $N_2$ gas serves as a purge gas. Thus, the interior of the process chamber 201 is purged, and the residual gas and the reaction byproducts remaining in the process chamber 201 are removed from the interior of the process chamber 201 (purge). Thereafter, the internal atmosphere of the process chamber 201 is substituted with an inert gas (inert gas substitution), and the internal pressure of the process chamber 201 is returned to atmospheric pressure (return to atmospheric pressure).

(Unloading Step)

Thereafter, the seal cap 219 is moved down by the boat elevator 115 to open the lower end of the manifold 209. The processed wafers 200 supported by the boat 217 are unloaded from the lower end of the manifold 209 outside of the reaction tube 203 (boat unloading). After the boat unloading, the shutter 219s is moved and the lower end opening of the manifold 209 is sealed by the shutter 219s via the O-ring 220c (shutter close). The processed wafers 200 are discharged from the boat 217 (wafer discharge).

(3) Processing Procedures and Processing Conditions of Steps 1p to 3p

The composition of a film formed on the wafer 200 can be controlled by appropriately selecting the processing conditions of steps 1, 2 and 3 within the aforementioned range. Such a change in composition makes it possible to appropriately control the quality (e.g., etching resistance and insulating property) of a film formed on the wafer 200. However, the intensive studies made by the present inventors have revealed that it is often difficult to increase the quality of a film formed on the wafer 200 over a certain level no matter how the processing conditions of steps 1, 2 and 3 are controlled with high precision. In addition, in order to further improve the quality of the film formed in the wafer 200, the intensive studies made by the present inventors have revealed that it is necessary to appropriately select the processing conditions of steps 1p, 2p and 3p, in addition to the processing conditions of steps 1, 2 and 3. Specifically, it is necessary to appropriately set the processing conditions of steps 1p, 2p and 3p not equally but differently, the reason of which will be described in detail below.

As described above, the first layer formed at step 1 becomes a Cl- and Si-containing layer. However, Cl contained in the first layer is separated from the first layer when the modifying process by the TEA gas is performed at step 2. In addition, Cl remaining in the second layer without being completely removed at step 2 is also separated from the second layer when the modifying process by the $O_2$ gas is performed at step 3. As a result, a high quality film (SiOC film or SiOCN film) containing fewer impurities, such as Cl or the like, in the film is formed on the wafer 200.

However, the intensive studies made by the present inventors have revealed that even the aforementioned film forming sequence may leave a very small amount of impurities, such as Cl or the like, in the film formed on the wafer 200. In addition, it has been revealed that a small amount of Cl or the like contained in the film may deteriorate etching resistance or insulating property of the film. It is believed that the reason for the deterioration of etching resistance of the film is that the small amount of Cl or the like contained in the film produces a Si—C bond and inhibits a Si—C bond, a Si—N bond or a Si—Si bond from being formed in the film. The S—Cl bond has a weaker bonding power than the Si—C bond, the Si—N bond or the Si—Si bond. Therefore, when hydrogen fluoride (HF) or the like is supplied to the film containing Cl, the Si—Cl bond included in the film is broken, which makes it easier to proceed with etching. In addition, it is believed that the reason for the deterioration of insulating property of the film is that Cl contained in the film entraps electrons, which generates a leak path in the film.

The present inventors have made intensive studies to further enhance the film etching resistance and insulating property and have found that the film etching resistance and insulating property can be further enhanced by appropriately adjusting the processing procedures or conditions of steps 1p to 3p and appropriately setting the procedures or conditions to be different when necessary. Suitable setting examples of the processing procedures or conditions of steps 1p to 3p will be described below. The following setting examples may be used in proper combination.

(Setting Example A1)

In this setting example, a time period for performing step 1p of removing the HCDS gas (hereinafter denoted by $T_{1p}$) is set to be longer than a time period for performing step 2p of removing the TEA gas (hereinafter denoted by $T_{2p}$) ($T_{1p} > T_{2p}$). FIG. 4A illustrates one example where $T_{1p}$ is set to be longer than $T_{2p}$ ($T_{1p} > T_{2p}$) and $T_{2p}$ is set to be equal to a time period for performing step 3p of removing the $O_2$ gas (hereinafter denoted by $T_{3p}$) ($T_{2p} = T_{3p}$). "$T_{2p}$" used herein refers to a time period during which a TEA purge effect to be described later is obtained.

By setting $T_{1p}$ as described above, it is possible to enhance an effect of removing the HCDS gas or the like from the process chamber 201. In addition, by setting $T_{1p}$ as described above, it is possible to promote desorption of Cl contained in the first layer formed on the wafer 200 from the first layer. This is because at least a portion of the film having a weak adsorptive power (bonding power) among Cl atoms contained in the first layer may be desorbed from the first layer when a purge gas is supplied into the first layer for a predetermined time (i.e., when the purge gas is ejected to the wafer 200 for a predetermined time. In addition, since the wafer 200 is in a state where it is heated, the Cl atoms contained in the first layer are moved. Thus, when this state is held for a predetermined time, the Cl atoms are likely to be desorbed from the first layer. Accordingly, by setting $T_{1p}$ to be relatively long as described above, it is possible to promote desorption of Cl from the first layer. Hereinafter, these effects will be generally referred to an "HCDS purge effect." This HCDS purge effect makes it possible to more reduce impurities such as Cl or the like contained in the film formed on the wafer 200 than a case of $T_{1p} \le T_{2p}$. In addition, the present inventors have confirmed that the HCDS purge effect cannot be enhanced even when step 1p is performed for a time period which is equal to $T_{2p}$ required to obtain a TEA purge effect to be described later. That is to say, when $T_{1p} = T_{2p}$, it has been confirmed that the Cl concentration in the film formed on the wafer 200 cannot be further reduced, thereby deteriorating etching resistance or insulating property of the film. In addition, in order to enhance the HCDS purge effect, it has been confirmed that step 1p must be performed for a time period which is longer than at least $T_{2p}$ required to obtain the TEA purge effect. That is to say, in order to enhance the HCDS purge effect, it has been confirmed that it is necessary to set the condition of $T_{1p} > T_{2p}$ rather than the condition of $T_{1p} = T_{2p}$.

Under the condition of $T_{1p} > T_{2p}$, $T_{1p}$ is set to fall within a range of, e.g., 30 to 120 seconds, specifically 45 to 90 seconds, more specifically 50 to 60 seconds.

If $T_{1p}$ is less than 30 seconds, the aforementioned HCDS purge effect cannot be enhanced. Thus, there may be a case where it is difficult to reduce impurities such as Cl or the like contained in the film formed on the wafer 200. When $T_{1p}$ is set to be more than 30 seconds, the HCDS purge effect can be enhanced, which makes it possible to reduce impurities such as Cl or the like contained in the film formed on the wafer 200. When $T_{1p}$ is set to be more than 45 seconds, the HCDS purge effect can be further enhanced, which makes it possible to further reduce impurities such as Cl or the like contained in the film formed on the wafer 200. When $T_{1p}$ is set to be more than 50 seconds, the HCDS purge effect can be reliably enhanced, which makes it possible to reliably reduce impurities such as Cl or the like contained in the film formed on the wafer 200.

If $T_{1p}$ exceeds 120 seconds, the HCDS purge effect is saturated, which may result in increase in deposition costs due to waste of a purge gas or deterioration of the productivity of a film forming process due to lengthening of a cycle time. When $T_{1p}$ is set to be less than 120 seconds, it is possible to suppress the purge gas consumption properly and avoid deterioration of the productivity while obtaining the HCDS purge effect reliably. When $T_{1p}$ is set to be less than 90 seconds, it is possible to suppress the purge gas consumption reliably and avoid deterioration of the productivity reliably while obtaining the HCDS purge effect reliably. When $T_{1p}$ is set to be less than 60 seconds, it is possible to suppress the purge gas consumption more reliably and avoid deterioration of the productivity more reliably while obtaining the HCDS purge effect reliably.

The present inventors have confirmed that it is possible to reliably reduce the Cl concentration in the film formed on the wafer 200 when $T_{1p}$ is set to fall within a range of 40 to 80 seconds and each of $T_{2p}$ and $T_{3p}$ is set to fall within a range of 10 to 15 seconds. In addition, the present inventors have confirmed that, when $T_{1p} \le T_{2p}$, for example, when each of $T_{1p}$, $T_{2p}$ and $T_{3p}$ is set to fall within a range of 10 to 15 seconds, the HCDS purge effect cannot be obtained, which results in increase of the Cl concentration in the film formed on the wafer 200.

(Setting Example A2)

In this setting example, $T_{1p}$ is set to be longer than $T_{2p}$ and $T_{1p}$ is also set to be longer than $T_{3p}$ ($T_{1p} > T_{2p}$ and $T_{1p} > T_{3p}$). $T_{2p}$ refers to a time period during which the TEA purge effect to be described later is obtained and $T_{3p}$ refers to a time period during which an $O_2$ purge effect to be described later is obtained. This setting example achieves the same effects as the setting example A1. In addition, under the condition of $T_{1p} > T_{3p}$, by securing $T_{1p}$ sufficiently, it is possible to reduce impurities such as Cl or the like contained in the film formed on the wafer 200 more reliably than the condition of $T_{1p} \le T_{3p}$. FIG. 4A illustrates one example of the condition of $T_{1p} > T_{2p}$ and $T_{1p} > T_{3p}$.

(Setting Example A3)

Figure 4B:
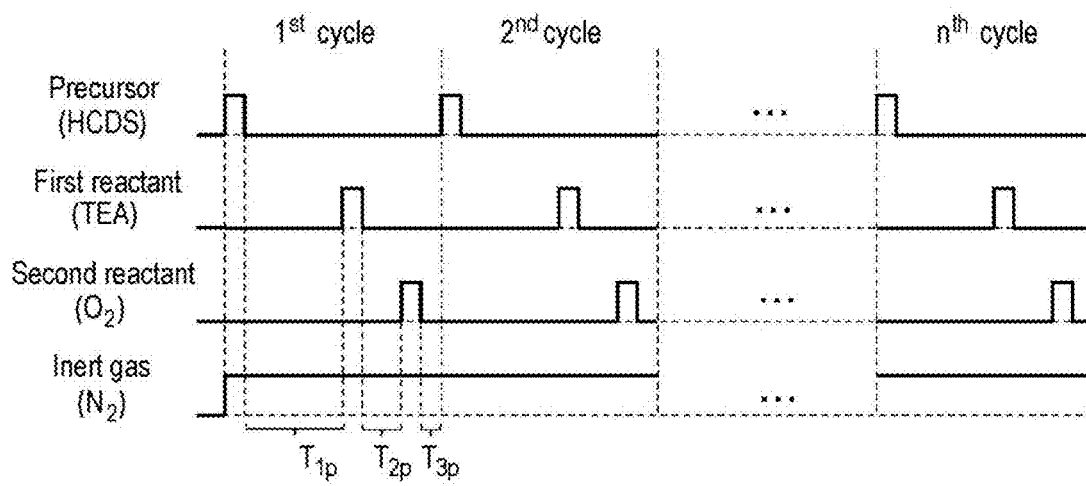
FIG. 4B is a diagram illustrating another example of the film forming sequence according to the first embodiment of the present disclosure.

In this setting example, $T_{1p}$ is set to be longer than $T_{2p}$ and $T_{2p}$ is set to be longer than $T_{3p}$ ($T_{1p} > T_{2p} > T_{3p}$). FIG. 4B illustrates one example of the condition of $T_{1p} > T_{2p} > T_{3p}$. $T_{2p}$ refers to a time period during which the TEA purge effect to be described later is obtained and $T_{3p}$ refers to a time period during which the $O_2$ purge effect to be described later is obtained.

This setting example also achieves the same effects as the setting example A1. In addition, by setting $T_{2p}$ to be longer than $T_{3p}$, i.e., by securing $T_{2p}$ sufficiently, it is possible to enhance an effect of removing the TEA gas or the like from the process chamber 201. In addition, it is possible to desorb at least a portion of H atoms or Cl atoms contained in the second layer from the second layer. In addition, it is possible to desorb N atoms or C atoms having a weak bonding power contained in the second layer, i.e., at least some of impurities contained in the film formed on the wafer 200, from the second layer. Hereinafter, these effects will be generally referred to as a "TEA purge effect." This TEA purge effect makes it possible to reduce more impurities contained in the film formed on the wafer 200 than the condition of $T_{2p} \leq T_{3p}$.

The present inventors have confirmed that, when $T_{1p}$ is set to fall within a range of 40 to 80 seconds, $T_{2p}$ is set to fall within a range of 20 to 30 seconds, and $T_{3p}$ is set to fall within a range of 10 to 15 seconds, it is possible to reduce not only the Cl and H concentrations in the film formed on the wafer 200 and but also the concentrations of N and C having a weak bonding power contained in the film.

(Setting Example A4)

In this setting example, while the relationship between $T_{1p}$, $T_{2p}$ and $T_{3p}$ is set as one of the aforementioned setting examples A1 to A3, the internal pressure of the process chamber 201 in step 1p of removing the HCDS gas (hereinafter denoted by $P_{1p}$) is set to be lower than the internal pressure of the process chamber 201 in step 2p of removing the TEA gas (hereinafter denoted by $P_{2p}$) ($P_{1p} < P_{2p}$). "$P_{2p}$" used herein refers to a pressure at which the aforementioned TEA purge effect is obtained.

This setting example also achieves the same effects as the setting examples A1 to A3. In addition, by setting $P_{1p}$ as described above, HCDS molecules or the like remaining in the process chamber 201 can be easily moved, which makes it possible to further enhance the HCDS purge effect. As a result, it is possible to more reduce impurities such as Cl or the like contained in the film formed on the wafer 200 than the condition of $P_{1p} \geq P_{2p}$.

In addition, in this example, without the relationship between $T_{1p}$, $T_{2p}$ and $T_{3p}$ set as the setting examples A1 to A3, $P_{1p}$ may be set to be lower than $P_{2p}$ ($P_{1p} < P_{2p}$). For example, under the condition of $T_{1p} = T_{2p} = T_{3p}$, $P_{1p}$ may be set to be lower than $P_{2p}$. Thus, this setting example achieves the same effects as the setting example A1.

(Setting Example A5)

In this setting example, $P_{1p}$ is set to be lower than the internal pressure of the process chamber 201 in step 3p of removing the $O_2$ gas (hereinafter denoted by $P_{3p}$) in the setting example A4 ($P_{1p} < P_{2p}$ and $P_{1p} < P_{3p}$). "$P_{3p}$" used herein refers to a pressure at which the aforementioned $O_2$ purge effect is obtained. This setting example also achieves the same effect as the setting example A4. In addition, under the condition of $P_{1p} < P_{3p}$, by reducing $P_{1p}$ sufficiently, it is possible to reduce more impurities such as Cl or the like contained in the film formed on the wafer 200 than the condition of $P_{1p} < P_{2p}$ and $P_{1p} \geq P_{3p}$.

In addition, in this example, without the relationship between $T_{1p}$, $T_{2p}$ and $T_{3p}$ set as the setting examples A1 to A3, $P_{1p}$ may be set to be lower than $P_{2p}$ and $P_{3p}$ ($P_{1p} < P_{2p}$ and $P_{1p} < P_{3p}$). For example, under the condition of $T_{1p} = T_2 = T_{3p}$, $P_{1p}$ may be set to be lower than $P_{2p}$ and $P_{3p}$. Thus, this setting example achieves the same effects as the setting example A2.

(Setting Example A6)

In this setting example, $P_{2p}$ is set to be lower than $P_{3p}$ in the setting example A5 ($P_{1p} < P_{2p} < P_{3p}$). This setting example also achieves the same effects as the setting example A5. In addition, under the condition of $P_{2p} < P_{3p}$, by reducing $P_{2p}$ sufficiently, it is possible to further enhance the aforementioned TEA purge effect. Thus, it is possible to reduce more H atoms contained in the film formed on the wafer 200 or more N atoms or C atoms having a weak bonding power contained in the film than the condition of $P_{1p} < P_{2p}$ and $P_{2p} \geq P_{3p}$.

In addition, in this example, without the relationship between $T_{1p}$, $T_{2p}$ and $T_{3p}$ set as the setting examples A1 to A3, $P_{1p}$ may be set to be lower than $P_{2p}$ and $P_{2p}$ may be set to be lower than $P_{3p}$ ($P_{1p} < P_{2p} < P_{3p}$). For example, under the condition of $T_{1p} = T_{2p} = T_{3p}$, $P_{1p}$ may be set to be lower than $P_{2p}$ and $P_{2p}$ may be set to be lower than $P_{3p}$. Thus, this setting example achieves the same effects as the setting example A3.

(Setting Example A7)

In this setting example, while the relationship between $T_{1p}$, $T_{2p}$ and $T_{3p}$ is set as one of the aforementioned setting examples A1 to A3, a purge gas flow rate ($F_{1p}$) in step 1p of removing the HCDS gas is set to be larger than a purge gas flow rate ($F_2$) in step 2p of removing the TEA gas ($F_{1p} < F_{2p}$). "$F_{2p}$" used herein refers to a flow rate at which the aforementioned TEA purge effect is obtained.

This setting example also achieves the same effects as the setting examples A1 to A3. In addition, by setting $F_{1p}$ as described above, it is possible to further enhance the HCDS purge effect. As a result, it is possible to reduce more impurities such as Cl or the like contained in the film formed on the wafer 200 than the condition of $F_{1p} \leq F_{2p}$.

In addition, in this example, without the relationship between $T_{1p}$, $T_{2p}$ and $T_{3p}$ set as the setting examples A1 to A3, $F_{1p}$ may be set to be larger than $F_{2p}$ ($F_{1p} > F_{2p}$). For example, under the condition of $T_{1p} = T_2 = T_{3p}$, $F_{1p}$ may be set to be larger than $F_{2p}$. Thus, this setting example achieves the same effects as the setting example A1.

(Setting Example A8)

In this setting example, $F_{1p}$ is set to be larger than a purge gas flow rate ($F_{3p}$) in step 3p of removing the $O_2$ gas in the setting example A7 ($F_{1p} < F_{2p}$ and $F_{1p} > F_{3p}$). "$F_{3p}$" used herein refers to a flow rate at which the aforementioned $O_2$ purge effect is obtained. This setting example also achieves the same effects as the setting example A7. In addition, under the condition of $F_{1p} > F_{3p}$, by increasing $F_{1p}$ sufficiently, it is possible to reduce more impurities such as Cl or the like contained in the film formed on the wafer 200 than the condition of $F_{1p} \leq F_{3p}$.

In addition, in this example, without the relationship between $T_{1p}$, $T_{2p}$ and $T_{3p}$ set as the setting examples A1 to A3, $F_{1p}$ may be set to be larger than $F_{2p}$ and $F_{3p}$ ($F_{1p} > F_{2p}$ and $F_{1p} > F_{3p}$). For example, under the condition of $T_{1p} = T_2 = T_{3p}$, $P_{1p}$ may be set to be larger than $F_{2p}$ and $F_{3p}$. Thus, this setting example achieves the same effects as the setting example A2.

(Setting Example A9)

M this setting example, $F_{2p}$ is set to be larger than $F_{3p}$ in the setting example A8 ($F_{1p} > F_{2p} > F_{3p}$). This setting example also achieves the same effects as the setting example A8. In addition, under the condition of $F_{2p} > F_{3p}$, by increasing $F_{2p}$ sufficiently, it is possible to further enhance the aforementioned TEA purge effect. Thus, it is possible to reduce more H atoms contained in the film formed on the wafer 200 or more N atoms or C atoms having a weak bonding power contained in the film than the condition of $F_{2p} \leq F_{3p}$.

In addition, in this example, without the relationship between $T_{1p}$, $T_{2p}$ and $T_{3p}$ set as the setting examples A1 to A3, $F_{1p}$ may be set to be larger than $F_{2p}$ and $F_{2p}$ may be set to be larger than $F_{3p}$ ($F_{1p} > F_{2p} > F_{3p}$). For example, under the condition of $T_{1p} = T_2 = T_{3p}$, $F_{1p}$ may be set to be larger than $F_{2p}$ and $F_{2p}$ may be set to be larger than $F_{3p}$. Thus, this setting example achieves the same effects as the setting example A3.

(Setting Example A10)

In this setting example, while the relationship between $T_{1p}$, $T_{2p}$ and $T_{3p}$ is set as one of the aforementioned setting examples A1 to A3, an H-containing gas, which is a reducing gas, is used as a purge gas in step 1p of removing the HCDS gas, and an inert gas such as a $N_2$ gas or the like is used as a purge gas in step 2p of removing the TEA gas and step 3p of removing the $O_2$ gas. As the reducing gas (the H-containing gas), it may be possible to use, e.g., an $H_2$ gas or a deuterium ($D_2$) gas.

This setting example also achieves the same effects as the setting examples A1 to A3. In addition, by using the H-containing gas as the purge gas in step 1p, it is possible to react the H-containing gas with the HCDS gas remaining in the process chamber 201 or react the H-containing gas with the Cl- and H-containing gas contained in the first layer. As a result, it is possible to reduce more impurities such as Cl or the like contained in/formed on the wafer 200 than a case where an inert gas such as a $N_2$ gas or the like is used as a purge gas in step 1p.

In addition, without the relationship between $T_{1p}$, $T_{2p}$ and $T_{3p}$ set as the setting examples A1 to A3, the H-containing gas may be used as the purge gas in step 1p. For example, under the condition of $T_{1p}=T_{2p}=T_{3p}$, the $H_2$ gas may be used as the purge gas in step 1p and the $N_2$ gas may be used as the purge gas in steps 2p and 3p. Thus, this setting example achieves the same effects as the setting example A1.

(Setting Example A11)

In this setting example, while the relationship between $T_{1p}$, $T_{2p}$ and $T_{3p}$ is set as one of the aforementioned setting examples A1 to A3, a plasma-excited gas is used as a purge gas in step 1p of removing the HCDS gas, and a non-plasma-excited gas, for example, an inert gas such as a $N_2$ gas or the like, is used as a purge gas in step 2p of removing the TEA gas and step 3p of removing the $O_2$ gas. As the non-plasma-excited gas, in addition to the $N_2$ gas, it may be possible to use, e.g., a rare gas such as an Ar gas, a He gas, a Ne gas, a Xe gas or the like. As the plasma-excited gas, it may be possible to use, e.g., a reducing gas such as an $H_2$ gas, a $D_2$ gas or the like. Power applied between the rod-shaped electrodes 269 and 270 in step 1p is set to fall within a range of, e.g., 50 to 1,000 W. The internal pressure of the process chamber 201 in step 1p is set to fall within a range of e.g., 1 to 500 Pa, specifically 1 to 100 Pa.

This setting example also achieves the same effects as the setting examples A1 to A3. In addition, by using the plasma-excited gas as the purge gas in step 1p, it is possible to apply high energy of the plasma-excited gas to the HCDS gas remaining in the process chamber 201 and Cl contained in the first layer. Thus, it is possible to further enhance the aforementioned HCDS purge effect. As a result, it is possible to reduce more impurities such as Cl or the like contained in/formed on the wafer 200 than a case where an inert gas such as a $N_2$ gas or the like is used as a purge gas in step 1p. In addition, using the reducing gas such as the $H_2$ gas, the $D_2$ gas or the like as the plasma-excited gas can provide the aforementioned HCDS purge effect better than a case where an inert gas such as a N2 gas, a rare gas or the like is used as the plasma-excited gas.

In addition, without the relationship between $T_{1p}$, $T_{2p}$ and $T_{3p}$ set as the setting examples A1 to A3, the plasma-excited gas may be used as the purge gas in step 1p. For example, under the condition of $T_{1p}=T_{2p}=T_{3p}$, a plasma-excited Ar gas (Ar* gas), $N_2$ gas ($N_2$* gas) or $H_2$ gas ($H_2$* gas) may be used as the purge gas in step 1p and the $N_2$ gas may be used as the purge gas in steps 2p and 3p. Thus, this setting example achieves the same effects as the setting example A1.

(Setting Example A12)

In this setting example, while the relationship between $T_{1p}$, $T_{2p}$ and $T_{3p}$ is set as one of the aforementioned setting examples A1 to A3, a cycle purge process of alternately performing, a predetermined number of times (once or more), a sub-step (purge step) A of supplying a purge gas to the process chamber 201 and a sub-step (vacuum step) B of evacuating the interior of the process chamber 201 under a condition where the supply of the purge gas to the process chamber 201 is stopped or substantially stopped is performed in step 1p of removing the HCDS gas. As used herein, the phrase "the supply of the purge gas is substantially stopped" refers to a purge gas being supplied at a flow rate smaller than a flow rate of the purge gas supplied at the sub-step A, i.e., a purge gas is slightly supplied. In addition, in step 2p of removing the TEA gas and step 3p of removing the $O_2$ gas, the purge gas is supplied into the process chamber 201 while exhausting the interior of the process chamber 201. That is to say, the cycle purge process is not performed in steps 2p and 3p.

This setting example also achieves the same effects as the setting examples A1 and A3. In addition, by performing the cycle purge process in step 1p, it is possible to generate a proper pressure fluctuation in the process chamber 201. Thus, it is possible to further enhance the aforementioned HCDS purge effect. As a result, it is possible to reduce more impurities such as Cl or the like contained in the film formed on the wafer 200 than a case where the cycle purge process is not performed in step 1p.

In addition, in this setting example, while the relationship between $T_{1p}$, $T_{2p}$ and $T_{3p}$ is set as one of the aforementioned setting examples A1 to A3, the aforementioned sub-steps A and B may be alternately performed a first predetermined number of times, i.e., $m_1$ times ($m_1$ is an integer of 2 or more), in step 1p of removing the HCDS gas, and the aforementioned sub-steps A and B may be alternately performed a second predetermined number of times, i.e., $m_2$ times ($m_2$ is an integer of 1 or more), in step 2p of removing the TEA gas and step 3p of removing the $O_2$ gas. As used herein, "$m_2$" refers to a number of times by which the aforementioned TEA purge effect or an $O_2$ purge effect to be described later is obtained. By setting $m_1$ to be larger than $m_2$ ($m_1>m_2$), this setting example achieves the same effects as the setting examples A1 and A3.

In addition, in this setting example, without the relationship between $T_{1p}$, $T_{2p}$ and $T_{3p}$ set as the setting examples A1 to A3, the processing procedure of steps 1p to 3p may be set as described above. For example, under the condition of $T_{1p}=T_{2p}=T_{3p}$, the cycle purge process may be performed in step 1p and may not be performed in steps 2p and 3p. In addition, for example, the cycle purge process may be performed in all of steps 1p to 3p and the sub-steps A and B may be alternately performed $m_1$ times in step 1p and may be alternately performed $m_2$ times in steps 2p and 3p respectively. In this case, $m_1$ is set to be larger than $m_2$ ($m_1>m_2$).

(4) Effects According to the Present Embodiment

According to the present embodiment, one or more effects set forth below may be achieved.

(a) As described above, when the cycle non-simultaneously performing steps 1 to 3 is performed a predetermined number of times, Cl contained in the first layer is desorbed from the first layer by performing the modifying process by the TEA gas in step 2. In addition, Cl remaining in the second layer since Cl cannot be all removed in step 2 is desorbed from the second layer by performing the modifying process by the O₂ gas in step 3. As a result, it is possible to form a high quality film containing fewer impurities such as Cl or the like on the wafer 200.

(b) By setting the processing procedures or conditions of steps 1p to 3p as the aforementioned setting examples A1 to A12, it is possible to enhance the HCDS purge effect in step 1p or the TEA purge effect in step 2p. Thus, it is possible to form a high quality film containing a very small amount of impurities such as Cl or the like on the wafer 200. That is to say, it is possible to form a film having high etching resistance and good insulating property on the wafer 200.

(c) The processing procedures or conditions of steps 1p to 3p are appropriately set not equally but differently. That is to say, a purge effect of a particular step selected from steps 1p to 3p is relatively enhanced rather than enhancing purge effects of all of steps 1p to 3p. Thus, it is possible to avoid an increase in deposition costs due to waste of purge gas or a deterioration in the productivity of a film forming process due to the lengthening of cycle time. In addition, like the setting example A11, by using plasma only in a particular step and not in the other steps, it is possible to avoid plasma damage to the wafer 200 and members in the process chamber 201. In addition, like the setting example A11, by performing the cycle purge process only in a particular step and not in the other steps, it is possible to avoid complexity of control.

(d) The aforementioned effects can be equally achieved in a case where a Si-containing gas other than the HCDS gas is used as the precursor, a case where a N-, C- and H-containing gas other than the TEA gas is used as the first reactant, and a case where an O-containing gas other than the O₂ gas is used as the second reactant.

<Second Embodiment of the Present Disclosure>

The aforementioned film forming sequence supplies the HDCS gas, the TEA gas and the O₂ gas non-simultaneously. Thus, as opposed to a case where they gases are supplied simultaneously, it is possible to avoid an excessive gas phase reaction and improve in-plane film thickness uniformity and step coverage of a film formed on the wafer 200. However, the intensive studies made by the present inventors have revealed that even the aforementioned film forming sequence may deteriorate in-plane film thickness uniformity and in-plane film quality uniformity (hereinafter simply referred to as "in-plane uniformity") of the film formed on the wafer 200. According to the intensive studies made by the present inventors, in order to further improve the in-plane uniformity of the film formed on the wafer 200, it is necessary not only to non-simultaneously perform steps 1, 2 and 3 but also to appropriately select the processing conditions of steps 1p, 2p and 3p. Specifically, it is necessary to appropriately set the processing conditions of steps 1p, 2p and 3p not equally but differently, the reason of which will be described in detail below.

In performing step 3 of supplying the O₂ gas to the wafer 200, there may be a case where the O₂ gas is adhered to and remains in the inner wall of the process chamber 201, the surface of the wafer 200, and so on. There may be a case where the O₂ gas adhered to the inner wall of the process chamber 201 and so on remains in the inner wall of the process chamber 201 and so on even after step 3p of removing the O₂ gas is terminated. In addition, the remaining O₂ gas may be desorbed from the inner wall of the process chamber 201 and so on. In addition, there may be a case where the O₂ gas desorbed from the inner wall of the process chamber 201 and so on after the termination of step 3p reacts with the HCDS gas supplied to the process gas 201 in step 1 of the next cycle to thereby deposit an undesired reactant (such as SiO or the like) on the wafer 200. This gas phase reaction is likely to occur in a wide space in the process chamber 201. For example, this gas phase reaction tends to become stronger in a space between the inner wall of the process chamber 201 and the outer periphery of the wafer 200 than in a space between adjacent wafers 200. Therefore, more undesired reactant may be likely to be deposited on the outer peripheral portion of the wafer 200 than on the central portion of the wafer 200. As a result, a film formed on the wafer 200 may become thicker in the vicinity of the outer periphery thereof than in the central portion thereof, which may result in deterioration of the in-plane film thickness uniformity of the film. In addition, the film formed on the wafer 200 may have a different quality between the central portion thereof and the vicinity of the outer periphery thereof, which may result in deterioration of the in-plane film quality uniformity of the film.

The present inventors have made intensive studies to further enhance the in-plane uniformity of the film formed on the wafer 200 and have found that the in-plane uniformity of the film formed on the wafer 200 can be further enhanced by appropriately adjusting the processing procedures or conditions of steps 1p to 3p and differently setting them in an appropriate manner. Suitable setting examples of the processing procedures or conditions of steps 1p to 3p will be described below. The following setting examples may be used in proper combination.

(Setting Example B1)

Figure 5A:
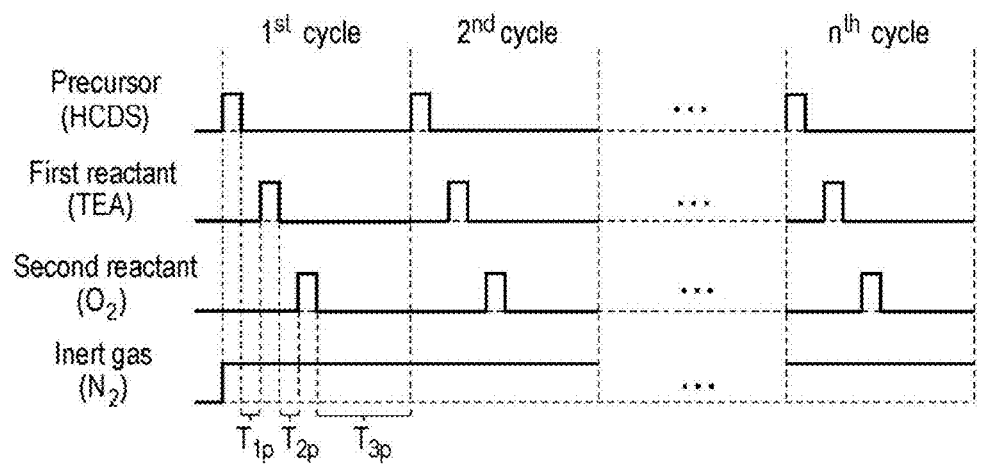
FIG. 5A is a diagram illustrating one example of a film forming sequence according to a second embodiment of the present disclosure and FIG. 5B is a diagram illustrating another example of the film forming sequence according to the second embodiment of the present disclosure.

In this setting example, a time period ($T_{3p}$) for performing step 3p of removing the O₂ gas is set to be longer than a time period ($T_2$) for performing step 2p of removing the TEA gas ($T_{3p} > T_{2p}$). FIG. 5A illustrates one example where $T_{3p}$ is set to be longer than $T_{2p}$ ($T_{1p} > T_{2p}$) and $T_{1p}$ is set to be equal to $T_{2p}$ ($T_{1p} = T_{2p}$). "$T_{2p}$" used herein refers to a time period during which the aforementioned TEA purge effect is obtained.

By setting $T_{3p}$ as described above, it is possible to enhance an effect of removing the O₂ gas or the like from the process chamber 201. Hereinafter, this effect will be referred to as an "O₂ purge effect." Thus, it is possible to enhance an effect of desorbing the O₂ gas from the inner wall of the process chamber 201 and so on before starting step 1 performed in the next cycle. As a result, it is possible to suppress an unintended gas phase reaction in step 1 performed in the next cycle, thereby enhancing the in-plane uniformity of the film formed on the wafer 200. In addition, the present inventors have confirmed that the O₂ purge effect cannot be enhanced even when step 3p is performed for a time period which is equal to $T_{2p}$ required to obtain the aforementioned TEA purge effect. That is to say, when $T_{3p} = T_{2p}$, it has been confirmed that the unintended gas phase reaction in step 1 cannot be further suppressed, thereby deteriorating the in-plane uniformity of the film formed on the wafer 200. In addition, in order to enhance the O₂ purge effect, it has been confirmed that step 3p must be performed for a time period which is longer than at least $T_{2p}$ required to obtain the TEA purge effect. That is to say, in order to enhance the O₂ purge effect, it has been confirmed that it is necessary to set the condition of $T_{3p} > T_{2p}$ rather than the condition of $T_{3p} = T_{2p}$.

Under the condition of $T_{3p} > T_{2p}$, $T_{3p}$ is set to fall within a range of, e.g., 20 to 100 seconds, specifically 25 to 80 seconds, more specifically 30 to 60 seconds.

If $T_{3p}$ is less than 20 seconds, the aforementioned $O_2$ purge effect cannot be enhanced. Thus, there may be a case where it is difficult to desorb the $O_2$ gas from the inner wall of the process chamber 201 and so on. When $T_{3p}$ is set to be more than 20 seconds, the $O_2$ purge effect can be sufficiently enhanced, which makes it possible to desorb the $O_2$ gas from the inner wall of the process chamber 201 and so on, thereby improving the in-plane uniformity of the film formed on the wafer 200. When $T_{3p}$ is set to be more than 25 seconds, the $O_2$ purge effect can be further enhanced, which makes it possible to further improve the in-plane uniformity of the film formed on the wafer 200. When $T_{3p}$ is set to be more than 30 seconds, the $O_2$ purge effect can be reliably enhanced, which makes it possible to reliably improve the in-plane uniformity of the film formed on the wafer 200.

If $T_{3p}$ exceeds 100 seconds, the $O_2$ purge effect is saturated, which may result in increase in deposition costs due to waste of a purge gas or deterioration of the productivity of a film forming process due to lengthening of a cycle time. When $T_{3p}$ is set to be less than 100 seconds, it is possible to suppress the purge gas consumption properly and avoid deterioration of the productivity while obtaining the $O_2$ purge effect reliably. When $T_{3p}$ is set to be less than 80 seconds, it is possible to suppress the purge gas consumption reliably and avoid deterioration of the productivity reliably while obtaining the $O_2$ purge effect reliably. When $T_{3p}$ is set to be less than 60 seconds, it is possible to suppress the purge gas consumption more and avoid deterioration of the productivity more reliably while obtaining the $O_2$ purge effect reliably.

The present inventors have confirmed that it is possible to reliably improve the in-plane uniformity of the film formed on the wafer 200 when $T_{3p}$ is set to fall within a range of 40 to 80 seconds and each of $T_{1p}$ and $T_{2p}$ is set to fall within a range of 10 to 15 seconds. In addition, the present inventors have confirmed that, when $T_{3p} \leq T_{2p}$, for example, when each of $T_{1p}$ to $T_{3p}$ is set to fall within a range of 10 to 15 seconds, the $O_2$ purge effect cannot be obtained, which results in deterioration of the in-plane uniformity of the film formed on the wafer 200.

(Setting Example B2)

In this setting example, $T_{3p}$ is set to be longer than $T_{2p}$ and $T_{3p}$ is also set to be longer than $T_{1p}$ ($T_{3p} > T_{2p}$ and $T_{3p} > T_{1p}$). As used herein, $T_{2p}$ refers to a time period during which the TEA purge effect is obtained and $T_{1p}$ refers to a time period during which the HCDS purge effect is obtained. This setting example also achieves the same effects as the setting example B1. In addition, under the condition of $T_{3p} > T_{1p}$, by securing $T_{3p}$ sufficiently, it is possible to improve the in-plane uniformity of the film formed on the wafer 200 more reliably than the condition of $T_{3p} \leq T_{1p}$. FIG. 5A illustrates one example of the condition of $T_{3p} > T_{2p}$ and $T_{3p} > T_{1p}$.

(Setting Example B3)

Figure 5B:
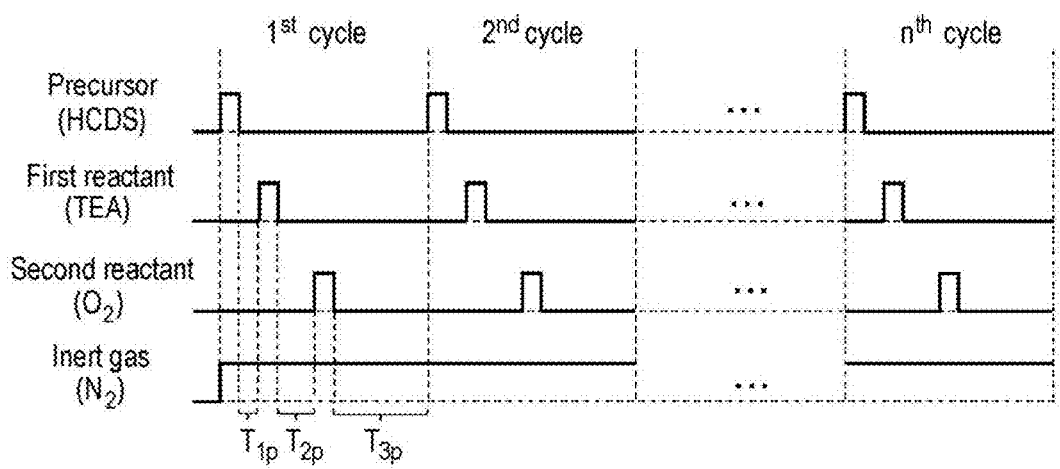

In this setting example, $T_{3p}$ is set to be longer than $T_{2p}$ and $T_{2p}$ is set to be longer than $T_{1p}$ ($T_{3p} > T_{2p} > T_{1p}$). FIG. 5B illustrates one example of the condition of $T_{3p} > T_{2p} > T_{1p}$. As used herein, $T_{2p}$ refers to a time period during which the TEA purge effect is obtained and $T_{1p}$ refers to a time period during which the HCDS purge effect is obtained.

This setting example also achieves the same effects as the setting example B 1. In addition, by setting $T_{2p}$ to be longer than $T_{1p}$, it is possible to enhance an effect of removing the TEA gas or the like from the process chamber 201 (TEA purge effect). Thus, it is possible to desorb the TEA gas from the inner wall of the process chamber 201 and so on and suppress an unintended gas phase reaction in the following step 3 or step 1 performed in the next cycle. As a result, it is possible to improve the in-plane uniformity of the film formed on the wafer 200 more reliably than the condition of $T_{2p} \leq T_{1p}$.

The present inventors have confirmed that, when $T_{3p}$ is set to fall within a range of 40 to 80 seconds, $T_{2p}$ is set to fall within a range of 20 to 30 seconds, and $T_{1p}$ is set to fall within a range of 10 to 15 seconds, it is possible to improve the in-plane uniformity of the film formed on the wafer 200 more reliably than the condition of $T_{2p} \leq T_{1p}$.

(Setting Example B4)

In this setting example, while the relationship between $T_{1p}$, $T_{2p}$ and $T_{3p}$ is set as one of the aforementioned setting examples B to B3, the internal pressure ($P_{3p}$) of the process chamber 201 in step 3p of removing the $O_2$ gas is set to be lower than the internal pressure ($P_2$) of the process chamber 201 in step 2p of removing the TEA gas ($P_{3p} < P_{2p}$). "$P_{2p}$" used herein refers to a pressure at which the TEA purge effect is obtained.

This setting example also achieves the same effects as the setting examples B1 to B3. In addition, by setting $P_{3p}$ as described above, $O_2$ molecules or the like remaining in the process chamber 201 can be easily moved, which makes it possible to further enhance the $O_2$ purge effect. As a result, it is possible to improve the in-plane uniformity of the film formed on the wafer 200 more than the condition of $P_{3p} \geq P_{2p}$.

In addition, in this example, without the relationship between $T_{1p}$, $T_{2p}$ and $T_{3p}$ set as the setting examples B1 to B3, $P_{3p}$ may be set to be lower than $P_{2p}$ ($P_{3p} < P_{2p}$). For example, under the condition of $T_{1p} = T_{2p} = T_{3p}$, $P_{3p}$ may be set to be lower than $P_{2p}$. Thus, this setting example achieves the same effects as the setting example B1.

(Setting Example B5)

In this setting example, $P_{3p}$ is set to be lower than the internal pressure ($P_{1p}$) of the process chamber 201 in step 1p of removing the HCDS gas in the setting example B4 ($P_{3p} < P_{2p}$ and $P_{3p} < P_{1p}$). "$P_{1p}$" used herein refers to a pressure at which the HCDS purge effect is obtained. This setting example also achieves the same effect as the setting example B4. In addition, under the condition of $P_{3p} < P_{1p}$, by reducing $P_{3p}$ sufficiently, it is possible to improve the in-plane uniformity of the film formed on the wafer 200 more than the condition of $P_{3p} < P_{2p}$ and $P_{3p} \geq P_{1p}$.

In addition, in this example, without the relationship between $T_{1p}$, $T_{2p}$ and $T_{3p}$ set as the setting examples B1 to B3, $P_{3p}$ may be set to be lower than $P_{2p}$ and $P_{1p}$ ($P_{3p} < P_{2p}$ and $P_{3p} < P_{1p}$). For example, under the condition of $T_{1p} = T_{2p} = T_{3p}$, $P_{3p}$ may be set to be lower than $P_{2p}$ and $P_{1p}$. Thus, this setting example achieves the same effects as the setting example B2.

(Setting Example B6)

In this setting example, $P_{2p}$ is set to be lower than $P_{1p}$ in the setting example B5 $P_{3p} < P_{2p} < P_{1p}$). This setting example also achieves the same effects as the setting example B5. In addition, under the condition of $P_{2p} < P_{1p}$, by reducing $P_{2p}$ sufficiently, it is possible to further enhance the aforementioned TEA purge effect. Thus, it is possible to sufficiently desorb the TEA gas from the inner wall of the process chamber 201 and so on and suppress an unintended gas phase reaction in the following step 3 or step 1 performed in the next cycle. As a result, it is possible to improve the in-plane uniformity of the film formed on the wafer 200 more than the condition of $P_{3p} < P_{2p}$ and $P_{2p} \geq P_{1p}$.

In addition, in this example, without the relationship between $T_{1p}$, $T_{2p}$ and $T_{3p}$ set as the setting examples B1 to B3, $P_{3p}$ may be set to be lower than $P_{2p}$ and $P_{2p}$ may be set to be lower than $P_{1p}$ ($P_{3p} < P_{2p} < P_{1p}$). For example, under the condition of $T_{1p} = T_{2p} = T_{3p}$, $P_{3p}$ may be set to be lower than $P_{2p}$ and $P_{2p}$ may be set to be lower than $P_{1p}$. Thus, this setting example achieves the same effects as the setting example B3.

(Setting Example B7)

In this setting example, while the relationship between $T_{1p}$, $T_{2p}$ and $T_{3p}$ is set as one of the aforementioned setting examples B1 to B3, a purge gas flow rate ($F_{3p}$) in step 3p of removing the $O_2$ gas is set to larger than a purge gas flow rate ($F_2$) in step 2p of removing the TEA gas ($F_{3p}<F_{2p}$). "$F_{2p}$" used herein refers to a flow rate at which the aforementioned TEA purge effect is obtained.

This setting example also achieves the same effects as the setting examples B1 to B3. In addition, by setting $F_{3p}$ as described above, it is possible to further enhance the $O_2$ purge effect. As a result, it is possible to improve the in-plane uniformity of the film formed on the wafer 200 more than the condition of $F_{3p} \leq F_{2p}$.

In addition, in this example, without the relationship between $T_{1p}$, $T_{2p}$ and $T_{3p}$ set as the setting examples B1 to B3, $F_{3p}$ may be set to be larger than $F_{2p}$ ($F_{3p}>F_{2p}$). For example, under the condition of $T_{1p}=T_{2p}=T_{3p}$, $F_{3p}$ may be set to be larger than $F_{2p}$. Thus, this setting example achieves the same effects as the setting example B1.

(Setting Example B8)

In this setting example, $F_{3p}$ is set to be larger than a purge gas flow rate ($F_{1p}$) in step 1p of removing the HCDS gas in the setting example B7 ($F_{3p}<F_{2p}$ and $F_{3p}>F_{1p}$). "$F_{1p}$" used herein refers to a flow rate at which the HCDS purge effect is obtained. This setting example also achieves the same effects as the setting example B7. In addition, under the condition of $F_{3p}>F_{1p}$, by increasing $F_{3p}$ sufficiently, it is possible to improve the in-plane uniformity of the film formed on the wafer 200 more than the condition of $F_{3p} \leq F_{1p}$.

In addition, in this example, without the relationship between $T_{1p}$, $T_{2p}$ and $T_{3p}$ set as the setting examples B1 to B3, $F_{3p}$ may be set to be larger than $F_{tp}$ and $F_{1p}$ ($F_{3p}>F_{2p}$ and $F_{3p}>F_{1p}$). For example, under the condition of $T_{1p}=T_{2p}=T_{3p}$, $P_{ap}$ may be set to be larger than $F_{2p}$ and $F_{1p}$. Thus, this setting example achieves the same effects as the setting example B2.

(Setting Example B9)

In this setting example, $F_{2p}$ is set to be larger than $F_{1p}$ in the setting example B8 ($F_{3p}>F_{2p}>F_{1p}$). This setting example also achieves the same effects as the setting example B8. In addition, under the condition of $F_{2p}>F_{1p}$, by increasing $F_{2p}$ sufficiently, it is possible to further enhance the aforementioned TEA purge effect. Thus, it is possible to improve the in-plane uniformity of the film formed on the wafer 200 more than the condition of $F_{2p} \leq F_{1p}$.

In addition, in this example, without the relationship between $T_{1p}$, $T_{2p}$ and $T_{3p}$ set as the setting examples B1 to B3, $F_{3p}$ may be set to larger than $F_{2p}$ and $F_{2p}$ may be set to larger than $F_{1p}$ ($F_{3p}>F_{2p}>F_{1p}$). For example, under the condition of $T_{1p}=T_2=T_{3p}$, $F_{3p}$ may be set to be larger than $F_{2p}$ and $F_{2p}$ may be set to larger than $F_{1p}$. Thus, this setting example achieves the same effects as the setting example B3.

(Setting Example B10)

In this setting example, while the relationship between $T_{1p}$, $T_{2p}$ and $T_{3p}$ is set as one of the aforementioned setting examples B1 to B3, a plasma-excited gas is used as a purge gas in step 3p of removing the $O_2$ gas, and a non-plasma-excited gas, for example, an inert gas such as a $N_2$ gas or the like, is used as a purge gas in step 1p of removing the HCDS gas and step 2p of removing the TEA gas. As the non-plasma-excited gas, in addition to the $N_2$ gas, it may be possible to use, e.g., a rare gas such as an Ar gas, a He gas, a Ne gas, a Xe gas or the like. As the plasma-excited gas, it may be possible to use, e.g., an $H_2$ gas, a $D_2$ gas or the like. Power applied between the rod-shaped electrodes 269 and 270 in step 1p is set to fall within a range of, e.g., 50 to 1,000 W. The internal pressure of the process chamber 201 in step 1p is set to fall within a range of e.g., 1 to 500 Pa, specifically 1 to 100 Pa.

This setting example also achieves the same effects as the setting examples B1 to B3. In addition, by using the plasma-excited gas as the purge gas in step 3p, it is possible to apply high energy of the plasma-excited gas to the $O_2$ gas remaining in the process chamber 201. Thus, it is possible to further enhance the aforementioned $O_2$ purge effect. As a result, it is possible to improve the in-plane uniformity of the film formed on the wafer 200 more than a case where an inert gas such as a $N_2$ gas or the like in a non-plasma-excited state is used as a purge gas in step 3p.

In addition, without the relationship between $T_{1p}$, $T_{2p}$ and $T_{3p}$ set as the setting examples B1 to B3, the plasma-excited gas may be used as the purge gas in step 3p. For example, under the condition of $T_{1p}=T_{2p}=T_{3p}$, an Ar* gas, a $N_2$* gas or a $H_2$* gas may be used as the purge gas in step 3p and the $N_2$ gas may be used as the purge gas in steps 1p and 2p. Thus, this setting example achieves the same effects as the setting example B.

(Setting Example B11)

In this setting example, while the relationship between $T_{1p}$, $T_{2p}$ and $T_{3p}$ is set as one of the aforementioned setting examples B1 to B3, a cycle purge process of alternately performing, a predetermined number of times (once or more), a sub-step A of supplying a purge gas to the process chamber 201 and a sub-step B of evacuating the interior of the process chamber 201 under a condition where the supply of the purge gas into the process chamber 201 is stopped or substantially stopped is performed in step 3p of removing the $O_2$ gas. In addition, in step 1p of removing the HCDS gas and step 2p of removing the TEA gas, the purge gas is supplied into the process chamber 201 while exhausting the interior of the process chamber 201. That is to say, the cycle purge process is not performed in steps 1p and 2p.

This setting example also achieves the same effects as the setting examples B1 and B3. In addition, by performing the cycle purge process in step 3p, it is possible to generate a proper pressure fluctuation in the process chamber 201. Thus, it is possible to further enhance the aforementioned $O_2$ purge effect. As a result, it is possible to improve the in-plane uniformity of the film formed on the wafer 200 more than a case where the cycle purge process is not performed in step 3p.

In addition, in this setting example, while the relationship between $T_{1p}$, $T_{2p}$ and $T_{3p}$ is set as one of the aforementioned setting examples B1 to B3, the aforementioned sub-steps A and B may be alternately performed a first predetermined number of times, i.e., $m_1$ times ($m_1$ is an integer of 2 or more), in step 3p of removing the $O_2$ gas, and the aforementioned sub-steps A and B may be alternately performed a second predetermined number of times (once or more), i.e., $m_2$ times ($m_2$ is an integer of 1 or more), in step 1p of removing the HCDS gas and step 2p of removing the TEA gas. As used herein, "$m_2$" refers to a number of times by which the HCDS purge effect or the TEA purge effect is obtained. By setting $m_1$ to be larger than $m_2$ ($m_1>m_2$), this setting example achieves the same effects as the setting examples A1 and A3.

In addition, in this setting example, without the relationship between $T_{1p}$, $T_{2p}$ and $T_{3p}$ set as the setting examples A1 to A3, the processing procedure of steps 1p to 3p may be set as described above. For example, under the condition of $T_{1p}=T_{2p}=T_{3p}$, the cycle purge process may be performed in step 3p and may not be performed in steps 1p and 2p. In addition, for example, the cycle purge process may be performed in all of steps 1p to 3p and the sub-steps A and B may be alternately performed $m_1$ times in step 3p and may be alternately performed $m_2$ times in steps 1p and 2p respectively. In this case, $m_1$ is set to be larger than $m_2$ ($m_1>m_2$).

According to the present embodiment, one or more effects set forth below may be achieved.

(a) As described above, by non-simultaneously supplying the HCDS gas, the TEA gas and the $O_2$ gas, it is possible to improve the in-plane uniformity and the like of the film formed on the wafer 200.

(b) By setting the processing procedures or conditions of steps 1p to 3p as the aforementioned setting examples B1 to B11, it is possible to enhance the $O_2$ purge effect in step 3p or the TEA purge effect in step 2p. Thus, it is possible to further improve the in-plane film thickness uniformity and in-plane film quality uniformity of the film formed on the wafer 200.

(c) A purge effect of a particular one selected from steps 1p to 3p is relatively enhanced rather than enhancing purge effects of all of the steps 1p to 3p. Thus, it is possible to avoid an increase in deposition costs due to waste of a purge gas or deterioration of the productivity of a film forming process due to lengthening of a cycle time.

(d) The aforementioned effects can be equally achieved in a case where a Si-containing gas other than the HCDS gas is used as the precursor, a case where a N—, C— and H-containing gas other than the TEA gas is used as the first reactant, and a case where an O-containing gas other than the $O_2$ gas is used as the second reactant.

<Other Embodiments of the Present Disclosure>

While some embodiments of the present disclosure have been specifically described above, the present disclosure is not limited to the aforementioned embodiments but may be differently modified without departing from the subject matter of the present disclosure.

The setting examples A1 to A12 shown in the first embodiment and the setting examples B1 to B11 shown in the second embodiment may be used in combination.

For example, as illustrated in FIG. 6, the time period of step 1p ($T_{1p}$) may be set to be longer than the time period of step 2p ($T_{2p}$) and the time period of step 3p ($T_{3p}$) may be set to be longer than $T_{2p}$ ($T_{1p}>T_{2p}$ and $T_{3p}>T_{2p}$). In other words, the time periods of steps 3p and 1p performed respectively before and after step 1 of supplying the HCDS gas may be set to be longer than the time period of step 2p.

In addition, for example, the internal pressure ($P_{1p}$) of the process chamber 201 in step 1p may be set to be lower than the internal pressure ($P_2$) of the process chamber 201 in step 2p and the internal pressure ($P_{3p}$) of the process chamber 201 in step 3p may be set to be lower than $P_{2p}$ ($P_{1p}<P_{2p}$ and $P_{3p}<P_{2p}$). In other words, the internal pressures of the process chamber 201 in steps 3p and 1p performed respectively before and after step 1 of supplying the HCDS gas may be set to be lower than the internal pressure of the process chamber 201 in step 2p.

In addition, for example, the purge gas flow rate ($F_{1p}$) in step 1p may be set to be larger than the purge gas flow rate ($F_2$) in step 2p and the purge gas flow rate ($F_{3p}$) in step 3p may be set to be larger than $F_{2p}$ ($F_{1p}>F_{2p}$ and $F_{3p}>F_{2p}$). In other words, the purge gas flow rates in steps 3p and 1p performed respectively before and after step 1 of supplying the HCDS gas may be set to be larger than the purge gas flow rate in step 2p.

In addition, for example, the plasma-excited gas may be used as the purge gas in steps 1p and 3p and the non-plasma-excited gas may be used as the purge gas in step 2p. In addition, for example, the cycle purge process may be performed in steps 1p and 3p and the cycle purge process may not be performed in step 2p. In addition, for example, the cycle purge process may be performed in all of the steps 1p, 2p and 3p and the number of times ($m_1$ and $m_3$) of performance of the cycle in steps 1p and 3p may be set to be more than the number of times ($m_2$) of performance of the cycle in step 2p.

In these cases, it is possible to obtain both of the effects of the aforementioned first and second embodiments. That is to say, it is possible to improve the etching resistance and insulating property of the film formed on the wafer 200 as well as the in-plane uniformity of the film.

In addition, for example, the present disclosure may be appropriately applied to a case where various kinds of Si-containing films such as a nitride film (SiN film), silicon oxide film (SiO film), silicon carbonitride film (SiCN film), silicon oxynitride film (SiON film), silicon boro-carbonitride (SiBCN film), silicon boronitride (SiBN film) and the like are formed on the wafer 200. In these cases, the same gases as in the aforementioned embodiments may be used as a precursor. As a reactant, in addition to the N— C— and H-containing gas (N and C source) such as the TEA gas and the O-containing gas (O source) such as the O2 gas, it may be possible to appropriately use, e.g., a N-containing gas (N source) such as an ammonia ($NH_3$) gas, a C-containing as (C source) such as a propylene ($C_3H_6$) gas, or a B-containing gas (B source) such as a trichloroborane ($BCl_3$) gas. These gases may be supplied after activated by heat or plasma. As the purge gas, the same gases as in the aforementioned embodiments may be used. Film forming sequences to which the present disclosure can be applied are listed as below.

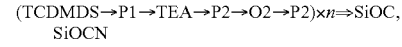

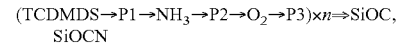

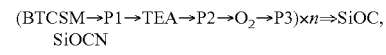

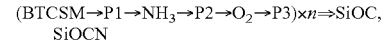

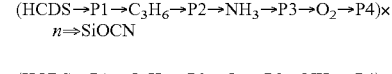

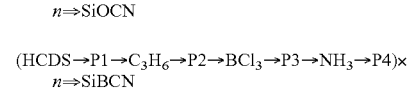

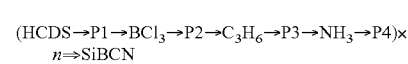

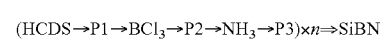

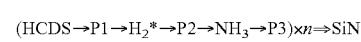

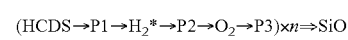

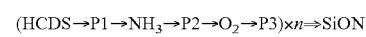

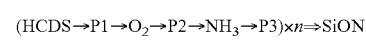

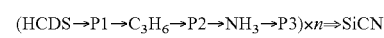

In addition, the present disclosure can be appropriately applied to a case where a B-containing film such as a boron carbonitride film (BCN film) or the like is formed. In this case, as the precursor, a chloroborane precursor gas such as a $BCl_3$ gas may be used. As the reactant, the various kinds of gases as mentioned above may be used. As the purge gas, the same gases as in the aforementioned embodiments may be used. Film forming sequences to which the present disclosure can be applied are listed below.

$(BCl_3 \to P1 \to C_3H_6 \to P2 \to NH_3 \to P3) \times n \Rightarrow BCN$ $(BCl_3 \to P1 \to TEA \to P2 \to NH_3 \to P3) \times n \Rightarrow BCN$ In addition, the present disclosure can be appropriately applied to a case where a film containing a metal element such as titanium (Ti), zirconium (Zr), hafnium (Hf), tantalum (Ta), niobium (Nb), molybdenum (Mo), tungsten (W), ruthenium (Ru), cobalt (Co), nickel (Ni), yttrium (Y), strontium (Sr), or aluminum (Al), instead of a semiconductor element such as Si. In this case, as the precursor, it may be possible to use, e.g., a chlorotitanium precursor gas containing Ti and a chloro group, such as a titanium tetrachloride ($TiCl_4$) gas, a gas containing Ta and a chloro group, such as a tantalum pentachloride ($TaCl_5$) gas, a chlorohafnium precursor gas containing Hf and a chloro group, such as a hafnium tetrafluoride ($HfF_4$) gas, or a gas containing Al and a methyl group, such as a trimethyl aluminum ($Al(CH_3)_3$, abbreviation: TMA) gas. As the reactant, the various kinds of gases as mentioned above may be used. As the purge gas, the same gases as in the aforementioned embodiments may be used. Film forming sequences to which the present disclosure can be applied are listed as below.

$(TiCl_4 \to P1 \to TMA \to P2 \to C_3H_6 \to P3) \times n \Rightarrow TiAlC$ $(TiCl_4 \to P1 \to C_3H_6 \to P2 \to TMA \to P3) \times n \Rightarrow TiAlC$ $(TiCl_4 \to P1 \to TMA \to P2 \to H_2^* \to P3) \times n \Rightarrow TiAlC$ $(TaCl_5 \to P1 \to TMA \to P2 \to C_3H_6 \to P3) \times n \Rightarrow TaAlC$ $(TaCl_5 \to P1 \to C_3H_6 \to P2 \to TMA \to P3) \times n \Rightarrow TaAlC$ $(TaCl_5 \to P1 \to TMA \to P2 \to H_2^* \to P3) \times n \Rightarrow TaAlC$ $(TiCl_4 \to P1 \to TMA \to P2 \to NH_3 \to P3) \times n \Rightarrow TiAlN$ $(TaCl_5 \to P1 \to TMA \to P2 \to NH_3 \to P3) \times n \Rightarrow TaAlN$ $(TiCl_4 \to P1 \to H_2^* \to P2 \to O_2 \to P3) \times n \Rightarrow TiO$ $(TiCl_4 \to P1 \to TEA \to P2 \to O_2 \to P3) \times n \Rightarrow TiOC, TiOCN$ $(TiCl_4 \to P1 \to NH_3 \to P2 \to O_2 \to P3) \times n \Rightarrow TiON$ $(TiCl_4 \to P1 \to C_3H_6 \to P2 \to BCl_3 \to P3 \to NH_3 \to P4) \times n \Rightarrow TiBCN$ $(TiCl_4 \to P1 \to BCl_3 \to P2 \to NH_3 \to P3) \times n \Rightarrow TiBN$ $(HfCl_4 \to P1 \to TMA \to P2 \to O_2 \to P3) \times n \Rightarrow HfAlO$ In addition, the present disclosure can be appropriately applied to a case where a film containing a metal element and a semiconductor element is formed. As the precursor, in addition to the various kinds of precursor gases as mentioned above, an aminosilane precursor gas such as a 3DMAS gas or the like may be used. As the reactant, the various kinds of gases as mentioned above may be used. As the purge gas, the same gases as in the aforementioned embodiments may be used. Film forming sequences to which the present disclosure can be applied are listed as below.

$(TiCl_4 \to P1 \to 3DMAS \to P2 \to NH_3 \to P3) \times n \Rightarrow TiSiN$ $(HfCl_4 \to P1 \to 3DMAS \to P2 \to O_2 \to P3) \times n \Rightarrow HfSiO$ That is to say, the present disclosure can be appropriately applied to a case where a film containing a metal element and a semiconductor element is formed. The processing procedures and conditions of the film forming process may be the same as those in the aforementioned embodiments. In these cases, the same effects as those of the aforementioned embodiments are achieved.

Recipes (programs describing processing procedures and processing conditions) used in substrate processing may be prepared individually according to the processing contents (the kind, composition ratio, quality, film thickness, processing procedure, processing condition and so on of a film to be formed) and may be stored in the memory device 121c via a telecommunication line or the external memory device 123. Moreover, at the start of the substrate processing, the CPU 121a may properly select an appropriate recipe from the recipes stored in the memory device 121c according to the processing contents. For example, when etching resistance and insulating property is required for a film formed on a wafer, a recipe setting the condition of $T_{1p} > T_{2p}$ may be selected. In addition, for example, when in-plane uniformity is required for a film formed on a wafer, a recipe setting the condition of $T_{3p} > T_{2p}$ may be selected. In addition, for example, when all of etching resistance, insulating property and in-plane uniformity are required for a film formed on a wafer, a recipe setting the condition of $T_{1p} > T_{2p}$ and $T_{3p} > T_{2p}$ may be selected. Thus, it is possible for a single substrate processing apparatus to form films of different kinds, composition ratios, qualities and thicknesses with enhanced reproducibility. In addition, it is possible to reduce an operator's burden (e.g., a burden borne by an operator when inputting processing procedures and processing conditions) and to quickly start the substrate processing while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the substrate processing apparatus.

In the aforementioned embodiments, there has been described an example in which films are formed using a batch-type substrate processing apparatus capable of processing a plurality of substrates at a time. The present disclosure is not limited to the aforementioned embodiments but may be appropriately applied to, e.g., a case where films are formed using a single-wafer-type substrate processing apparatus capable of processing a single substrate or several substrates at a time. In addition, in the aforementioned embodiments, there has been described an example in which films are formed using a substrate processing apparatus provided with a hot-wall-type processing furnace. The present disclosure is not limited to the aforementioned embodiments but may be appropriately applied to a case where films are formed using a substrate processing apparatus provided with a cold-wall-type processing furnace. Even in these cases, the processing procedures and processing conditions may be the same as those in the aforementioned embodiments.

Figure 9A:
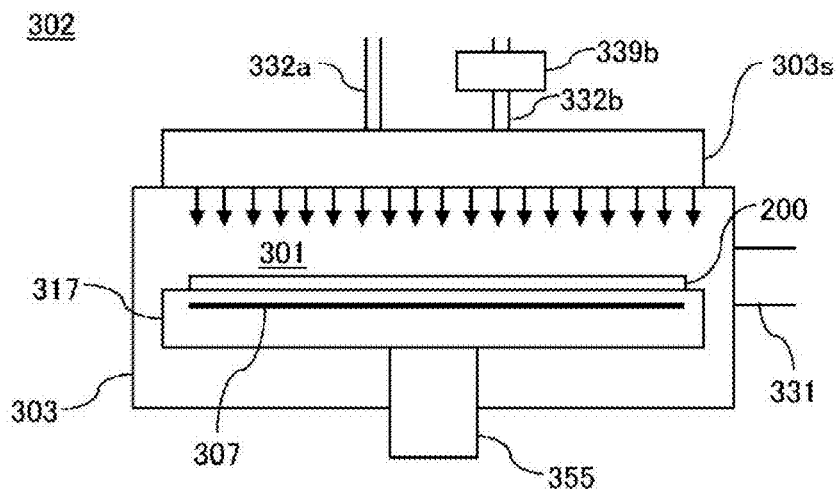
FIG. 9A is a schematic configuration view of a processing furnace of a substrate processing apparatus suitably used in another embodiment of the present disclosure, in which a portion of the processing furnace is shown in a vertical cross section.

The present disclosure may be suitably applied to, e.g., a case where a film is formed using a substrate processing apparatus provided with a processing furnace 302 illustrated in FIG. 9A. The processing furnace 302 includes a process vessel 303 which defines a process chamber 301, a shower head 303s as a gas supply part configured to supply a gas to the process chamber 301 in a shower-like manner, a support table 317 configured to horizontally support one or more wafers 200, a rotary shaft 355 configured to support the support table 317 from below, and a heater 307 installed in the support table 317. Gas supply ports 332a and 332b are connected to inlets (gas introduction holes) of the shower head 303s. A supply system similar to the precursor supply system and the inert gas supply system of the aforementioned embodiments is connected to the gas supply port 332a. A remote plasma unit (or a plasma generating device) 339b as an exciting unit configured to supply a gas by plasma-exciting the same and supply systems similar to the first reactant supply system, the second reactant supply system and the inert gas supply system of the aforementioned embodiments are connected to the gas supply port 332b. A gas distribution plate configured to supply a gas to the process chamber 301 in a shower-like manner is installed in outlets (gas discharge holes) of the shower head 303s. The shower head 303s is installed at such a position as to face the surfaces of the wafers 200 carried into the process chamber 301. An exhaust port 331 configured to evacuate the interior of the process chamber 301 is installed in the process vessel 303. An exhaust system similar to the exhaust systems of the aforementioned embodiments is connected to the exhaust port 331.

Figure 9B:
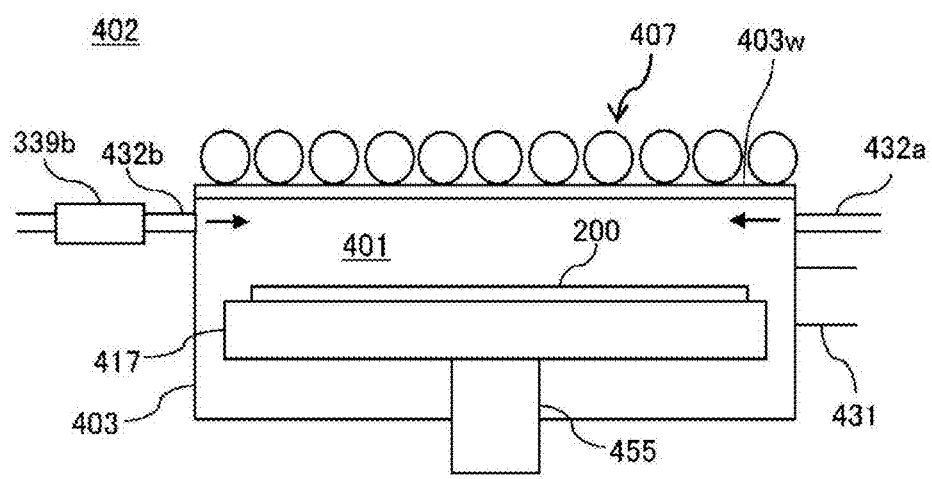
FIG. 9B is a schematic configuration view of a processing furnace of a substrate processing apparatus suitably used in a further embodiment of the present disclosure, in which a portion of the processing furnace is shown in a vertical cross section.

In addition, the present disclosure may be suitably applied to, e.g., a case where a film is formed using a substrate processing apparatus provided with a processing furnace 402 illustrated in FIG. 9B. The processing furnace 402 includes a process vessel 403 which defines a process chamber 401, a support table 417 configured to horizontally support one or more wafers 200, a rotary shaft 455 configured to support the support table 417 from below, a lamp heater 407 configured to irradiate light toward the wafers 200 disposed in the process vessel 403, and a quartz window 403w which transmits the light irradiated from the lamp heater 407. Gas supply ports 432a and 432b are connected to the process vessel 403. A supply system similar to the precursor supply system and the inert gas supply system of the aforementioned embodiments is connected to the gas supply port 432a. The aforementioned remote plasma unit 339b and supply systems similar to the first reactant supply system, the second reactant supply system and the inert gas supply system of the aforementioned embodiments are connected to the gas supply port 432b. The gas supply ports 432a and 432b are respectively installed at the lateral side of the end portions of the wafers 200 carried into the process chamber 401, namely at such positions as not to face the surfaces of the wafers 200 carried into the process chamber 401. An exhaust port 431 configured to evacuate the interior of the process chamber 401 is installed in the process vessel 403. An exhaust system similar to the exhaust systems of the aforementioned embodiments is connected to the exhaust port 431.

M the case of using these substrate processing apparatuses, film formation may be performed according to the same processing procedures and processing conditions as those in the aforementioned embodiments and the same effects as those of the aforementioned embodiments can be achieved.

The aforementioned embodiments may be used in proper combination. In addition, the processing procedures and processing conditions used at this time may be the same as those of the film forming sequences shown in the aforementioned embodiments.

EXAMPLE

Descriptions will now be made on the results of tests supporting the effects achieved in the aforementioned embodiments.

(Evaluation on Cl Concentration in Film)

As sample A, a SiOC film was formed on a wafer by performing, a predetermined number of times, a cycle that non-simultaneously performs the aforementioned steps 1 and 1p, steps 2 and 2p and steps 3 and 3p, using the substrate processing apparatus of the aforementioned embodiments. A HCDS gas was used as the precursor gas. A TEA gas was used as the first reactant. An $O_2$ gas was used as the second reactant. The gas supply time periods in steps 1 to 3 were set to the time period (T) ranging from 10 to 15 seconds. The time periods of steps 1p, 2p and 3p were set to six times of T (=6T), 1.5 times of T (=1.5T) and one time of T (=T), respectively. That is to say, the condition of $T_{1p}>T_{2p}>T_{3p}$ was set. Other processing conditions were set to fall within a range of the processing conditions described in the aforementioned embodiments.

As sample B, a SiOC film was formed on a wafer by performing, a predetermined number of times, a cycle that non-simultaneously performs the aforementioned steps 1 and 1p, steps 2 and 2p and steps 3 and 3p, using the substrate processing apparatus of the aforementioned embodiments. A HCDS gas was used as the precursor gas. A TEA gas was used as the first reactant. An $O_2$ gas was used as the second reactant. The gas supply time periods in steps 1 to 3 were set to the same time period as the aforementioned T. The time periods of steps 1p, 2p and 3p were set to one time of T (=T), 1.5 times of T (=1.5T) and one time of T (=T), respectively. That is to say, the condition of $T_{2p}>T_{1p}=T_{3p}$ was set. Other processing conditions were the same as those of sample A.

Cl concentration, etching resistance and insulating property for the SiOC films of the samples A and B were evaluated.

Figure 7A:
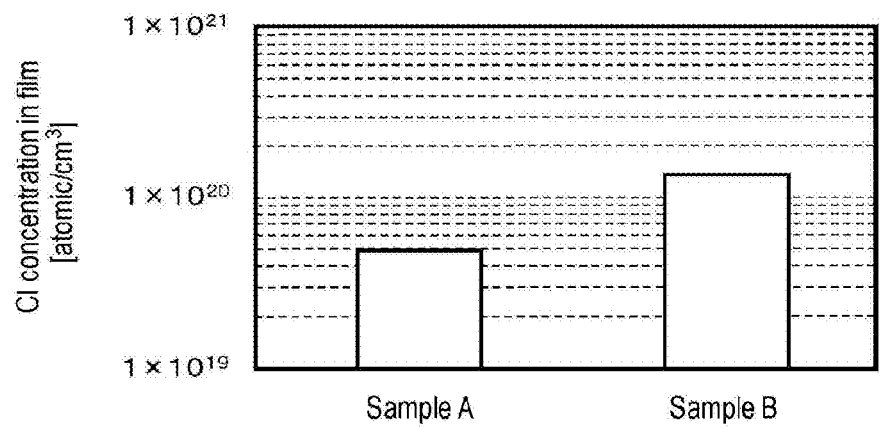
FIG. 7A is a diagram illustrating results of evaluation on chlorine concentration in a film.

FIG. 7A is a view showing the results of the evaluation on the Cl concentration in the SiOC films of the samples A and B. In FIG. 7A, a vertical axis represents Cl concentration [atomic/$cm^3$] and a horizontal axis represents the samples A and B. It can be seen from FIG. 7A that the Cl concentration is significantly lower in the sample A than in the sample B. That is to say, it can be seen that it is possible to reduce a concentration of impurities such as Cl or the like in the film formed on the wafer by setting the relationship between time periods of steps 1p to 3p to the condition of $T_{1p}>T_{2p}>T_{3p}$.

Figure 7B:
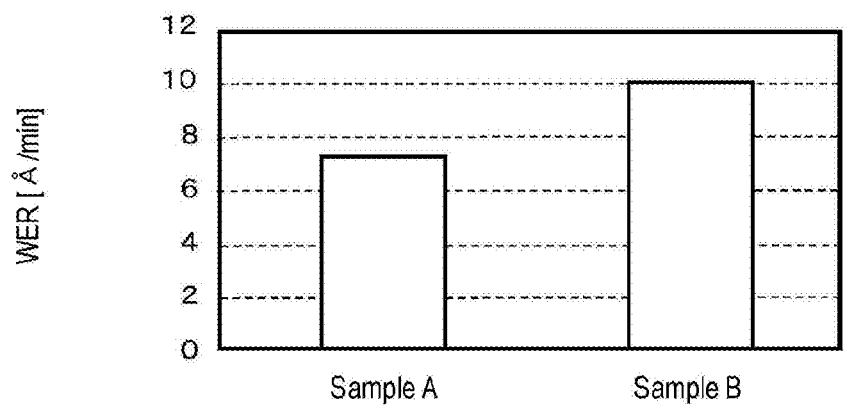
FIG. 7B is a diagram illustrating results of evaluation on etching resistance of a film.

FIG. 7B is a view showing the results of the evaluation on the etching resistance of the SiOC films of the samples A and B. In FIG. 7B, a vertical axis represents a wet etching rate (WER) [Å/min] when the SiOC films of the samples A and B are etched using a 1% HF aqueous solution, and a horizontal axis represents the samples A and B. It can be seen from FIG. 7B that the sample A provides smaller WER, i.e., higher etching resistance, than the sample B. It is believed that this is because the SiOC film of the sample A has fewer impurities such as Cl or the like contained in the film than the SiOC film of the sample B. That is to say, it is believed that this is because a Si—Cl bond having a weak bonding power in the SiOC film can be decreased by desorbing Cl from the film and formation of a Si—C bond or Si—Si bond having a strong bonding power can be promoted.

Figure 7C:
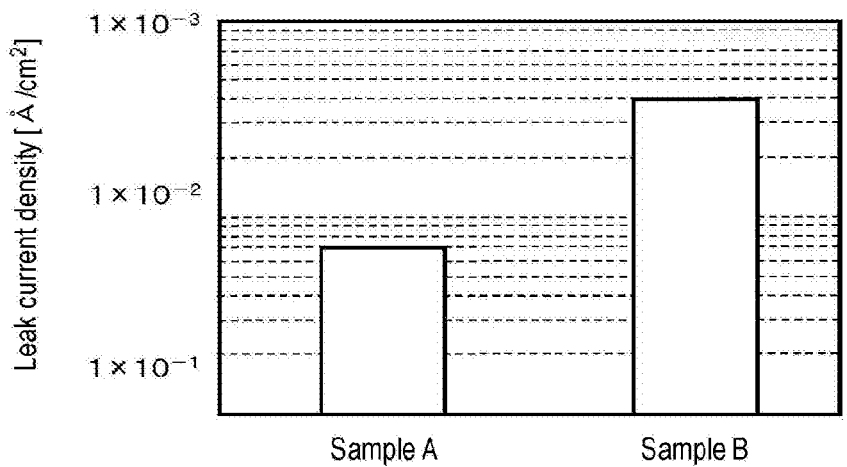
FIG. 7C is a diagram illustrating results of evaluation on insulating properties of a film.

FIG. 7C is a view showing the results of the evaluation on the insulating property of the SiOC films of the samples A and B. In FIG. 7C, a vertical axis represents a leak current density [Å/cm$^2$] when the same voltage is applied to the SiOC films of the samples A and B, and a horizontal axis represents the samples A and B. It can be seen from FIG. 7C that the sample A provides a smaller leak current density, i.e., better insulating property, than the sample B. It is believed that this is because the SiOC film of the sample A has fewer impurities such as Cl or the like contained in the film than the SiOC film of the sample B.

(Evaluation on in-Plane Film Thickness Uniformity)

As sample C, a SiOC film was formed on a wafer by performing, a predetermined number of times, a cycle that non-simultaneously performs the aforementioned steps 1 and 1p, steps 2 and 2p and steps 3 and 3p, using the substrate processing apparatus of the aforementioned embodiments. A HCDS gas was used as the precursor gas. A TEA gas was used as the first reactant. An O$_2$ gas was used as the second reactant. The gas supply time periods in steps 1 to 3 were set to the time period (T) ranging from 10 to 15 seconds. The time periods of steps 1p, 2p and 3p were set to one time of T (=T), 1.5 times of T (=1.5T) and six time of T (=6T), respectively. That is to say, the condition of $T_{3p} > T_{2p} > T_{1p}$ was set. Other processing conditions were set to fall within a range of the processing conditions described in the aforementioned embodiments.

As sample D, a SiOC film was formed on a wafer by performing, a predetermined number of times, a cycle that non-simultaneously performs the aforementioned steps 1 and 1p, steps 2 and 2p and steps 3 and 3p, using the substrate processing apparatus of the aforementioned embodiments. A HCDS gas was used as the precursor gas. A TEA gas was used as the first reactant. An O$_2$ gas was used as the second reactant. The gas supply time periods in steps 1 to 3 were set to the same time period as the aforementioned T. The time periods of steps 1p, 2p and 3p were set to one time of T (=T), 1.5 times of T (=1.5T) and one time of T (=T), respectively. That is to say, the condition of $T_{2p} > T_{1p} = T_{3p}$ was set. Other processing conditions were the same as those of sample A.

Mean film thickness and in-plane film thickness uniformity (hereinafter also referred to as WiW) for the SiOC films of the samples C and D were evaluated. WiW (%) is a value defined as [{(maximum film thickness in wafer plane−minimum film thickness in wafer plane)/(2×mean film thickness in wafer plane)}×100]. A smaller WiW value means higher film thickness uniformity in the wafer plane. In this evaluation, the thickness of the SiOC film was measured at 49 sites in the wafer plane and the mean film thickness and WiW were calculated based on the measurements.

FIG. 8 shows the results of the evaluation on film thickness map, mean film thickness (Å) and WiW (%) of the SiOC films in the samples C and D. It can be seen from FIG. 8 that the sample C provides smaller WiW, i.e., better in-plane film thickness uniformity, than the sample C. That is to say, it can be seen that it is possible to improve in-plane film thickness uniformity of the film formed on the wafer by setting the relationship between time periods of steps 1p to 3p to the condition of $T_{3p} > T_{2p} > T_{1p}$.

According to the present disclosure in some embodiments, it is possible to improve the quality of a film formed on a substrate.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising forming a film on a substrate by performing a cycle a predetermined number of times, the cycle including non-simultaneously performing:
   supplying a precursor containing silicon to the substrate in a process chamber;
   removing the precursor from the process chamber;
   supplying a first reactant containing nitrogen, carbon and hydrogen to the substrate in the process chamber;
   removing the first reactant from the process chamber;
   supplying a second reactant containing oxygen to the substrate in the process chamber; and
   removing the second reactant from the process chamber,
   wherein a time period of the act of removing the precursor is set to be longer than a time period of the act of removing the first reactant, and an internal pressure of the process chamber in the act of removing the precursor is set to be lower than the internal pressure of the process chamber in the act of removing the first reactant.

2. The method of claim 1, wherein the time period of the act of removing the precursor is set to be longer than the time period of the act of removing the first reactant, and the time period of the act of removing the precursor is set to be longer than the time period of the act of removing the second reactant.

3. The method of claim 2, wherein the time period of the act of removing the precursor is set to be longer than the time period of the act of removing the first reactant, and the time period of the act of removing the first reactant is set to be longer than the time period of the act of removing the second reactant.

4. The method of claim 1, wherein the internal pressure of the process chamber in the act of removing the precursor is set to be lower than the internal pressure of the process chamber in the act of removing the second reactant.

5. The method of claim 4, wherein the internal pressure of the process chamber in the act of removing the precursor is set to be lower than the internal pressure of the process chamber in the act of removing the first reactant, and the internal pressure of the process chamber in the act of removing the first reactant is set to be lower than the internal pressure of the process chamber in the act of removing the second reactant.

6. A method of manufacturing a semiconductor device, comprising forming a film on a substrate by performing a cycle a predetermined number of times, the cycle including non-simultaneously performing:
   supplying a precursor containing silicon to the substrate in a process chamber;
   removing the precursor from the process chamber;
   supplying a first reactant containing nitrogen, carbon and hydrogen to the substrate in the process chamber;
   removing the first reactant from the process chamber;

supplying a second reactant containing oxygen to the substrate in the process chamber; and removing the second reactant from the process chamber, wherein a time period of the act of removing the precursor is set to be longer than a time period of the act of removing the first reactant, or a time period of the act of removing the second reactant is set to be longer than the time period of the act of removing the first reactant, wherein the act of removing the second reactant includes performing a cycle a predetermined number of times, the cycle including alternately performing: supplying a purge gas into the process chamber and evacuating the interior of the process chamber under a condition where the supply of the purge gas into the process chamber is stopped or substantially stopped, and wherein each of the act of removing the precursor and the act of removing the first reactant includes supplying the purge gas into the process chamber while exhausting the interior of the process chamber.

7. The method of claim 1, wherein the film contains the silicon, oxygen and carbon.

8. A method of manufacturing a semiconductor device, comprising forming a film on a substrate by performing a cycle a predetermined number of times, the cycle including non-simultaneously performing:
supplying a precursor containing silicon to the substrate in a process chamber;
removing the precursor from the process chamber;
supplying a first reactant containing nitrogen, carbon and hydrogen to the substrate in the process chamber;
removing the first reactant from the process chamber;
supplying a second reactant containing oxygen to the substrate in the process chamber; and
removing the second reactant from the process chamber,
wherein each of the act of removing the precursor, the act of removing the first reactant and the act of removing the second reactant includes supplying a purge gas into the process chamber and exhausting the interior of the process chamber, and
wherein the time period of the act of removing the precursor is set to be longer than the time period of the act of removing the first reactant, and a supply flow rate of the purge gas in the act of removing the precursor is set to be larger than a supply flow rate of the purge gas in the act of removing the first reactant.

9. The method of claim 8, wherein the supply flow rate of the purge gas in the act of removing the precursor is set to be larger than the supply flow rate of the purge gas in the act of removing the second reactant.

10. The method of claim 9, wherein the supply flow rate of the purge gas in the act of removing the precursor is set to be larger than the supply flow rate of the purge gas in the act of removing the first reactant, and the supply flow rate of the purge gas in the act of removing the first reactant is set to be larger than the supply flow rate of the purge gas in the act of removing the second reactant.

11. A method of manufacturing a semiconductor device, comprising forming a film on a substrate by performing a cycle a predetermined number of times, the cycle including non-simultaneously performing:
supplying a precursor containing silicon to the substrate in a process chamber;
removing the precursor from the process chamber;
supplying a first reactant containing nitrogen, carbon and hydrogen to the substrate in the process chamber;
removing the first reactant from the process chamber;
supplying a second reactant containing oxygen to the substrate in the process chamber; and
removing the second reactant from the process chamber, wherein a time period of the act of removing the precursor is set to be longer than a time period of the act of removing the first reactant, or a time period of the act of removing the second reactant is set to be longer than the time period of the act of removing the first reactant, wherein the act of removing the precursor includes performing a cycle a predetermined number of times, the cycle including alternately performing: supplying a purge gas into the process chamber and evacuating the interior of the process chamber under a condition where the supply of the purge gas into the process chamber is stopped or substantially stopped, and wherein each of the act of removing the first reactant and the act of removing the second reactant includes supplying the purge gas into the process chamber while exhausting the interior of the process chamber.

12. A method of manufacturing a semiconductor device, comprising forming a film on a substrate by performing a cycle a predetermined number of times, the cycle including non-simultaneously performing:
supplying a precursor containing silicon to the substrate in a process chamber;
removing the precursor from the process chamber;
supplying a first reactant containing nitrogen, carbon and hydrogen to the substrate in the process chamber;
removing the first reactant from the process chamber;
supplying a second reactant containing oxygen to the substrate in the process chamber; and
removing the second reactant from the process chamber,
wherein the time period of the act of removing the second reactant is set to be longer than the time period of the act of removing the first reactant, and the time period of the act of removing the second reactant is set to be longer than the time period of the act of removing the precursor.

13. The method of claim 12, wherein the time period of the act of removing the second reactant is set to be longer than the time period of the act of removing the first reactant, and the time period of the act of removing the first reactant is set to be longer than the time period of the act of removing the precursor.

14. A method of manufacturing a semiconductor device, comprising forming a film on a substrate by performing a cycle a predetermined number of times, the cycle including non-simultaneously performing:
supplying a precursor containing silicon to the substrate in a process chamber;
removing the precursor from the process chamber;
supplying a first reactant containing nitrogen, carbon and hydrogen to the substrate in the process chamber;
removing the first reactant from the process chamber;
supplying a second reactant containing oxygen to the substrate in the process chamber; and
removing the second reactant from the process chamber,
wherein the time period of the act of removing the second reactant is set to be longer than the time period of the act of removing the first reactant, and an internal pressure of the process chamber in the act of removing the second reactant is set to be lower than an internal pressure of the process chamber in the act of removing the first reactant, and wherein the internal pressure of the process chamber in the act of removing the second reactant is set to be lower than an internal pressure of the process chamber in the act of removing the precursor.

15. The method of claim 14, wherein the internal pressure of the process chamber in the act of removing the second reactant is set to be lower than the internal pressure of the process chamber in the act of removing the first reactant, and the internal pressure of the process chamber in the act of removing the first reactant is set to be lower than the internal pressure of the process chamber in the act of removing the precursor.

16. A method of manufacturing a semiconductor device, comprising forming a film on a substrate by performing a cycle a predetermined number of times, the cycle including non-simultaneously performing:
  supplying a precursor containing silicon to the substrate in a process chamber;
  removing the precursor from the process chamber;
  supplying a first reactant containing nitrogen, carbon and hydrogen to the substrate in the process chamber;
  removing the first reactant from the process chamber;
  supplying a second reactant containing oxygen to the substrate in the process chamber; and
  removing the second reactant from the process chamber,
  wherein each of the act of removing the precursor, the act of removing the first reactant and the act of removing the second reactant includes supplying a purge gas into the process chamber and exhausting the interior of the process chamber, and
  wherein the time period of the act of removing the second reactant is set to be longer than the time period of the act of removing the first reactant, and a supply flow rate of the purge gas in the act of removing the second reactant is set to be larger than a supply flow rate of the purge gas in the act of removing the first reactant.

17. The method of claim 16, wherein the supply flow rate of the purge gas in the act of removing the second reactant is set to be larger than a supply flow rate of the purge gas in the act of removing the precursor.

18. The method of claim 17, wherein the supply flow rate of the purge gas in the act of removing the second reactant is set to be larger than the supply flow rate of the purge gas in the act of removing the first reactant, and the supply flow rate of the purge gas in the act of removing the first reactant is set to be larger than the supply flow rate of the purge gas in the act of removing the precursor.

* * * * *